(12) United States Patent
Mori

(10) Patent No.: US 9,520,576 B2
(45) Date of Patent: Dec. 13, 2016

(54) GAS BARRIER FILM AND ELECTRONIC APPARATUS

(71) Applicant: Konica Minolta, Inc., Tokyo (JP)

(72) Inventor: Takahiro Mori, Hachioji (JP)

(73) Assignee: KONICA MINOLTA, INC., Tokyo (JP)

(*) Notice: Subject to any disclaimer, the term of this patent is extended or adjusted under 35 U.S.C. 154(b) by 182 days.

(21) Appl. No.: 14/360,468

(22) PCT Filed: Nov. 16, 2012

(86) PCT No.: PCT/JP2012/079732
§ 371 (c)(1),
(2) Date: May 23, 2014

(87) PCT Pub. No.: WO2013/077255
PCT Pub. Date: May 30, 2013

(65) Prior Publication Data
US 2014/0322478 A1    Oct. 30, 2014

(30) Foreign Application Priority Data

Nov. 24, 2011   (JP) .................................. 2011-255660

(51) Int. Cl.
*H01L 51/52*      (2006.01)
*H05K 5/06*       (2006.01)
*C08J 7/04*       (2006.01)

(52) U.S. Cl.
CPC ............ *H01L 51/5246* (2013.01); *C08J 7/042* (2013.01); *C08J 7/047* (2013.01); *H01L 51/5253* (2013.01);
(Continued)

(58) Field of Classification Search
None
See application file for complete search history.

(56) References Cited

U.S. PATENT DOCUMENTS

2007/0026243 A1* 2/2007 Iwanaga ............... C23C 16/308
428/446
2010/0166977 A1* 7/2010 Brand et al. ............. C08J 7/047
427/515
(Continued)

FOREIGN PATENT DOCUMENTS

CN      101233200 A       7/2008
JP      2000-229384 A     8/2000
(Continued)

OTHER PUBLICATIONS

International Preliminary Report on Patentability and Written Opinion, International Application No. PCT/JP2012/079732. Date of Issuance: May 27, 2014 (May 27, 2014) in Japanese and English (total of 9 pages).
Office Action dated Jan. 6, 2015 from the corresponding Chinese Patent Application No. 2012-80057161.3 and its English translation.
(Continued)

*Primary Examiner* — Ronak Patel
(74) *Attorney, Agent, or Firm* — Lucas & Mercanti, LLP

(57) ABSTRACT

A gas barrier film (10) that comprises a gas barrier layer (14), which is obtained by irradiating a layer that contains a polysilazane with vacuum ultraviolet light, on a base (11) is formed to contain a compound (A) that satisfies all of the conditions (a), (b) and (c) described below in an amount within the range from 1% by mass to 40% by mass (inclusive) relative to the total mass of the gas barrier layer. (a) The compound (A) has an Si—O bond and an organic group that is directly bonded to Si. (b) The compound (A) has an Si—H group or an Si—OH group. (c) The compound (A) has a molecular weight of from 90 to 1,200 (inclusive).

7 Claims, 3 Drawing Sheets

(52) U.S. Cl.
CPC ............ *H05K 5/069* (2013.01); *C08J 2483/16* (2013.01); *Y10T 428/239* (2015.01); *Y10T 428/24364* (2015.01); *Y10T 428/265* (2015.01)

(56) References Cited

U.S. PATENT DOCUMENTS

| | | | |
|---|---|---|---|
| 2012/0107607 A1* | 5/2012 | Takaki | C08J 7/047 428/336 |
| 2012/0157624 A1* | 6/2012 | Saito | C08G 77/12 524/852 |
| 2013/0017400 A1* | 1/2013 | Imai | B32B 7/12 428/447 |

FOREIGN PATENT DOCUMENTS

| | | | |
|---|---|---|---|
| JP | 2009-503157 A | | 1/2009 |
| JP | 2009-255040 A | | 11/2009 |
| JP | 2010-167777 A | | 8/2010 |
| WO | WO2006/016672 A1 | | 2/2006 |
| WO | WO 2011/048894 | * | 4/2011 |
| WO | WO 2011/118520 | * | 9/2011 |
| WO | WO2012/117990 A1 | | 9/2012 |

OTHER PUBLICATIONS

L. Prager, et al; Leibniz Institute of Surface Modification Biannual Report; 2008/2009; UV-induced conversion of polysilazanes into . . . ; pp. 18-21.

* cited by examiner

GAS BARRIER FILM AND ELECTRONIC APPARATUS

CROSS REFERENCE TO RELATED APPLICATION

This Application is a 371 of PCT/JP2012/079732 filed on Nov. 16, 2012 which, in turn, claimed the priority of Japanese Patent Application No. JP2011-255660 filed on Nov. 16, 2012 both applications are incorporated herein by reference.

TECHNICAL FIELD

The present invention relates to a gas barrier film and an electronic apparatus including a gas barrier film.

BACKGROUND ART

Gas barrier films, each composed of a laminate of multiple layers including thin films of metal oxides, such as aluminum oxide, magnesium oxide, and silicon oxide, formed on a surface of a plastic substrate or a resin film, have been widely used for wrapping products that must block gases, such as water vapor and oxygen, more specifically for wrapping foods, industrial products, and pharmaceuticals to prevent alterations in their properties.

In addition to wrapping, gas barrier films have been widely studied for the application to sealants for electronic devices, such as flexible photovoltaic cells, organic electroluminescent (EL) elements, and liquid crystal display devices. Such sealants for electronic devices require excellent gas barrier properties equivalent to those of glass substrate material. Unfortunately, a gas barrier film that has sufficient capability has not yet been produced.

Known procedures for producing gas barrier films include gas phase processes, such as chemical deposition (plasma-assisted chemical vapor deposition (CVD)) and physical deposition (vacuum deposition and sputtering). In chemical deposition, organosilicone compounds, such as tetraethoxysilane (TEOS), are oxidized in oxygen plasma under reduced pressure while depositing an inorganic film on a substrate; while in physical deposition, metallic silicon is vaporized with a semiconductor laser to deposit an inorganic film on a substrate in the presence of oxygen.

Such gas phase processes have been preferably used for the formation of inorganic films composed of, for example, silicon oxide, silicon nitride, and silicon oxynitride. Thus, studies have been widely conducted on the compositions of inorganic films that have excellent gas barrier properties and the layer structure of such inorganic films. Unfortunately, the compositions and layer structures have not yet been specified that achieve excellent gas barrier properties.

It is significantly difficult to form an inorganic film without defects, such as pinholes and cracks, through the gas phase process described above. To prevent defects, for example, the film formation rate must be significantly reduced. Thus, a gas barrier film having properties that satisfy the requirements for a sealant for electronic devices at industrial levels in terms of productivity has not been produced. Studies have been conducted in the attempt to improve the gas barrier properties by simply increasing the thickness of an inorganic film produced through a gas phase process and forming a laminate of multiple inorganic films. Unfortunately, the gas barrier properties have not been improved due to the continuous growing of defects and/or increases in cracks.

In another study, an organic film has been disposed over an inorganic film formed through a gas phase process to form alternating layers of inorganic films and organic films. In this way, the total thickness of the inorganic films can be maintained while preventing the continuous growth of defects in the inorganic films and increasing the length of the permeation pathway of gases due to the non-uniform positions of the defects on the surfaces of the inorganic films. Such effect is known as a labyrinth effect and has been studied to improve the gas barrier properties. Under the present circumstances, the gas barrier properties are not satisfactory, and the production process is complicated. That is, the productivity compatible with the performance of the gas barrier film is significantly low. Thus, practical applications are deemed difficult due to costs.

A technical approach has been conducted on a gas barrier layer to provide a solution to the issues mentioned above. The gas barrier layer is formed by applying a solution of an inorganic precursor compound to a substrate and drying the substrate to form a film which is then modified, for example, by heat to improve the gas barrier properties. Specifically, a study has been conducted on the use of polysilazane as an inorganic precursor compound in order to achieve excellent gas barrier properties.

Polysilazane is a compound having a —($SiH_2$—NH)— basic structure, e.g., perhydropolysilazane. Heat treatment or humid heat treatment of polysilazane in an acidic atmosphere causes the polysilazane to chemically change to silicon oxynitride and then to silicon oxide. The direct replacement of nitrogen with oxygen by the action of oxygen and water vapor in the atmosphere causes a chemical change to silicon oxide with a relatively small volume reduction. Thus, it is known that a relatively dense film can be acquired with fewer defects due to a volume reduction. A relatively dense silicon oxynitride film can also be acquired through the control of the acidity of the atmosphere.

The formation of a dense silicon oxynitride or silicon oxide gas barrier layer through heat modification or humid heat modification of polysilazane requires a temperature of 450° C. or higher. Thus, a gas barrier layer cannot be formed on a flexible substrate (resin substrate), such as a plastic substrate.

A proposed solution to this problem is a method of forming a silicon oxynitride film or silicon oxide film by applying a polysilazane solution to form a film and modifying the film through irradiation with vacuum ultraviolet rays. Light (wavelength of 100 to 200 nm) referred to as vacuum ultraviolet rays (hereinafter referred to as "VUV" or "VUV light"), which has an energy greater than the interatomic bonding force of polysilazane, is used to promote oxidation by active oxygen or ozone while directly breaking the bonds between the atoms in polysilazane by only photons through a light quantum process. In this way, a silicon oxynitride film or silicon oxide film can be formed at a relatively low temperature.

Non-patent literature 1 discloses a method of producing a gas barrier film by irradiating polysilazane film with VUV light from an excimer lamp. In non-patent literature 1, the layer structure and production conditions of the gas barrier film are not studied in detail. Thus, the gas barrier properties of the resulting gas barrier film are far from the properties required for electronic devices.

Patent literature 1 discloses a method of producing a gas barrier film by irradiating polysilazane film containing a basic catalyst with VUV light and UV light. An embodiment thereof describes an example gas barrier film having three gas barrier layers formed by applying polysilazane to a resin substrate, drying the polysilazane layer, and irradiating the polysilazane with VUV light. However, the gas barrier properties of the resulting gas barrier film are far from the properties required for electronic devices. Patent literature 1 lists binder resins commonly used in the production of paint containing polysiloxane as a component other than a catalyst that can be added to a coating solution containing polysilazane. However, patent literature 1 does not suggest the improvement in the gas barrier properties through the addition of an appropriate amount of a compound having a specific structure other than catalysts.

Patent literature 2 discloses a gas barrier film including a laminate of two or more gas barrier layers, each layer being formed by applying a polysilazane film having a thickness of 250 nm or less on a resin substrate having a smooth surface (having a surface Ra value of less than 12 nm) and irradiating the polysilazane film with VUV light. A thin polysilazane film is provided in the attempt to prevent the generation of cracks during VUV light irradiation and improve the gas barrier properties through increases in the number of layers and the thickness of the film. Even if a laminate is formed of thin layers, cracks are generated at a total thickness of the gas barrier layers exceeding a certain value. Thus, the gas barrier properties required for electronic devices cannot be achieved. The productivity, including yield, of this approach is not high because a multi-layer structure is a prerequisite and the resin substrate having a smooth surface is prone to damage during shipping.

Patent literature 3 discloses a gas barrier film including an inorganic-organic composite copolymer film containing heat-curable silicone, which is a mixture of polysilazane and polysiloxane polymers. Although the inorganic-organic composite copolymer film does not substantially have gas barrier properties, it provides improved adhesiveness with an inorganic oxide layer having gas barrier properties disposed on the copolymer film and prevents cracks from forming in the inorganic oxide layer due to stress release. Patent literature 3 does not suggest the improvement in the gas barrier properties through the addition of an appropriate amount of compound having a specific structure to polysilazane and the irradiation with VUV light.

Gas barrier films have been in need that have excellent gas barrier properties required for electronic devices and excellent productivity.

PRIOR ART LITERATURES

Patent Literatures

Patent Literature 1: Japanese Translation of PCT International Application Laid-Open No. 2009-503157
Patent Literature 2: Japanese Patent Application Laid-Open No. 2009-255040
Patent Literature 3: Japanese Patent Application Laid-Open No. 2010-167777

Non-Patent Literatures

Non-patent Literature 1: Leibniz Institute of Surface Modification Biannual Report 2008/2009: pp. 18-21.

DISCLOSURE OF INVENTION

Problems to be Solved by the Invention

An object of the present invention, which has been conceived in light of the issues described above, is to provide a gas barrier film having excellent gas barrier properties and an electronic device including the gas barrier film.

Means for Solving Problems (1) In order to achieve the above-described object, a first aspect of the invention is a gas barrier film including: a gas barrier layer disposed over a substrate, the gas barrier layer being formed by irradiating a layer containing polysilazane with vacuum ultraviolet rays, wherein the gas barrier layer contains a compound A in an amount of 1 mass % or more and 40 mass % or less with respect to the entire gas barrier layer, the compound A satisfying all of following conditions (a), (b), and (c):

(a) the compound A has an Si—O bond and an organic group directly bonded to Si;

(b) the compound A has an Si—H group or an Si—OH group; and (c) the compound A has a molecular weight of 90 or more and 1200 or less.

(2) A second aspect of the invention is the gas barrier film according to item 1, wherein the compound A has a structure represented by a following general formula (1):

[Formula 1]

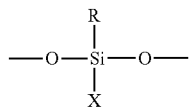

(1)

where R represents the organic group, and X represents H or OH.

(3) A third aspect of the invention is the gas barrier film according to items 1 or 2, wherein the compound A has a cyclic or cage structure including an Si—O—Si bond.

(4) A fourth aspect of the invention is the gas barrier film according to any one of items 1 to 3, wherein the organic group contains six carbon atoms or less.

(5) A fifth aspect of the invention is the gas barrier film according to any one of items 1 to 4, wherein the organic group is any one of a methyl group, an ethyl group, and a phenyl group.

(6) A sixth aspect of the invention is the gas barrier film according to any one of items 1 to 5, wherein the substrate has a surface roughness Rz of 200 nm or more and 500 nm or less.

(7) A seventh aspect of the invention is the gas barrier film according to any one of items 1 to 6, further including: at least one intermediate layer disposed between the substrate and the gas barrier layer, wherein a surface, in contact with the gas barrier layer, of the intermediate layer has a surface roughness Rz of 200 nm or more and 500 nm or less.

(8) An eighth aspect of the invention is the gas barrier film according to any one of items 1 to 7, wherein the gas barrier layer has a thickness of at least 250 nm.

(9) A ninth aspect of the invention is an electronic apparatus including: the gas barrier film according to any one of items 1 to 8; and an electronic device sealed with the gas barrier film.

Effects of the Invention

The present invention provides a gas barrier film having excellent gas barrier properties and an electronic apparatus including the gas barrier film.

EMBODIMENT FOR CARRYING OUT THE INVENTION

Figure 1:
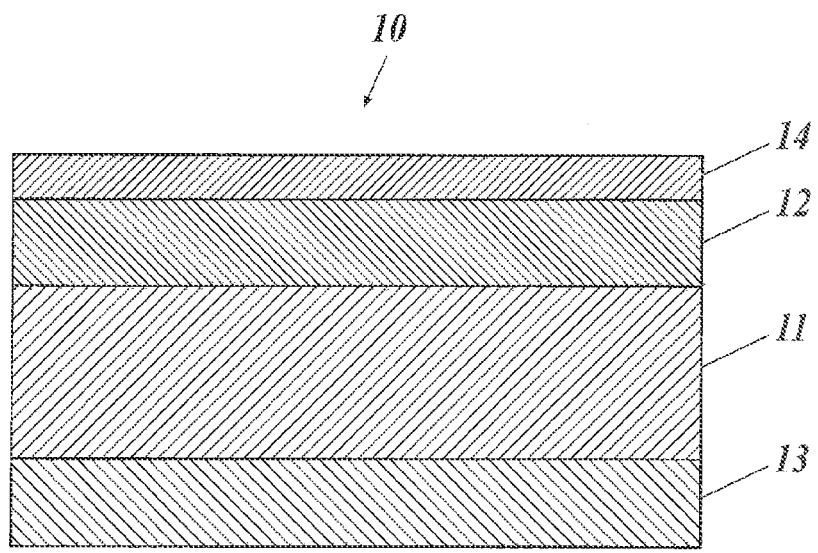
FIG. 1 is a schematic cross-sectional view of an example gas barrier film according to the present invention.

Preferred embodiments to carryout the present invention will now be described below with reference to the drawings. The following embodiments involve various technically preferred limitations for accomplishing the present invention. The scope of the invention, however, should not be limited to the embodiments and drawings.

The inventor has conducted extensive investigation on a gas barrier film having at least one gas barrier layer over a substrate, the gas barrier layer being formed by irradiating a layer containing polysilazane with vacuum ultraviolet rays (VUV light). The inventor has then discovered that a gas barrier layer containing 1 to 40 mass % (inclusive) of a compound A which satisfies all the following conditions (a), (b), and (c) with respect to the entire gas barrier layer enables a gas barrier film to be manufactured through a highly productive coating process and to exhibit excellent gas barrier properties required for a sealant of electronic devices:

(a) the compound A has an Si—O bond and an organic group directly bonded to Si;
(b) the compound A has an Si—H group or an Si—OH group; and
(c) the compound A has a molecular weight of 90 or more and 1200 or less.

Various approaches have been taken to improve the gas barrier properties through the VUV light irradiation of a film containing polysilazane.

For example, the VUV light irradiation of a film of perhydropolysilazane having no organic groups is known to yield satisfactory gas barrier properties. The absence of organic groups in perhydropolysilazane causes the film to be modified into a significantly hard inorganic film having a composition $SiO_XN_Y$ (typically, x is in the range of 0.2 to 2.3, y is in the range of 0.0 to 1.0, and H is not indicated) after irradiation with VUV light. During the irradiation, the density of the film increases, causing the film to contract and generate residual tensile stress. In general, although an increase in the intensity of the VUV light irradiation of a perhydropolysilazane film improves the gas barrier properties of the film, it also increases the contraction of the film, which causes ready cracking of the film. Thus, the substantial improvement in gas barrier properties is saturated. The flexibility also decreases and the film readily cracks when bent.

The cracking and low flexibility become more apparent with an increase in the thickness of the perhydropolysilazane film. A laminate of multiple perhydropolysilazane thin films slightly reduces cracking for the total thickness of the films. Unfortunately, the tendency of ready cracking still increases as the total thickness of the films increases. Thus, a significant improvement in the gas barrier properties of a gas barrier layer composed of a perhydropolysilazane film cannot be expected through a combination of simple approaches, such as increases in the intensity of the VUV light irradiation and the total thickness of the film.

An approach attempted to prevent cracking of a perhydropolysilazane film is mixing of perhydropolysilazane with an organic resin and/or polysilazane having organic groups; however, this approach does not solve the problem because the amount of additives required for preventing cracking causes significantly inferior gas barrier properties.

The inventor, who has attempted various approaches, has revealed that addition of an appropriate amount of compound having a specific structure and a molecular weight within a specific range to a polysilazane film can achieve the compatibility of improvement in the gas barrier properties and reduction in cracking of the film constituting a gas barrier layer. The inventor also revealed that, since a film can be thickened, a gas barrier layer is less susceptible to the surface roughness of the substrate. As a result, a gas barrier film having excellent gas barrier properties, flexibility, and productivity was produced.

A gas barrier film 10 according to the present invention includes at least one gas barrier layer 14 over a substrate 11, such as a resin film.

The gas barrier layer 14 contains polysilazane and is irradiated with vacuum ultraviolet rays. The gas barrier layer 14 contains a compound A within the range of 1 to 40 mass % (inclusive) with respect to the entire gas barrier layer, and the compound A satisfies all the following conditions (a), (b), and (c):

(a) the compound A has an Si—O bond and an organic group directly bonded to Si;
(b) the compound A has an Si—H group or an Si—OH group; and
(c) the compound A has a molecular weight of 90 or more and 1200 or less.

with reference to FIG. 1, the gas barrier film 10 includes a substrate 11, an intermediate layer 12 disposed on one side of the substrate 11, a gas barrier layer 14 disposed on the intermediate layer 12, and a bleed preventing layer 13 disposed on the other side of the substrate 11.

The gas barrier film 10 preferably includes an overcoat layer (protective layer) that covers the gas barrier layer 14. The gas barrier layer 14 may be disposed on each side of the substrate 11.

The configuration of the gas barrier film 10 according to the present invention will now be described in detail.

[Substrate]

The substrate 11 of the gas barrier film 10 according to the present invention is a flexible or bendable resin substrate. The substrate 11 may be composed of any film that can support the gas barrier layer 14.

Examples of the resin film applicable to the substrate 11 include films of resins, such as acrylic esters, methacrylic esters, polyethylene terephthalate (PET), polybutylene terephthalate, polyethylene naphthalate (PEN), polycarbonates (PC), polyarylates, polyvinyl chloride (PVC), polyethylene (PE), polypropylene (PP), polystyrene (PS), nylons (Ny), aromatic polyamides, polyether-ether-ketones, polysulfones, polyethersulfones, polyimides, and polyetherimides; heat-resistant transparent films having a basic skeleton of silsesquioxane with an organic-inorganic hybrid structure (for example, Sila-DEC (product name) manufactured by Chisso Corporation and Silplus (product name) manufactured by Nippon Steel Chemical Co., Ltd.); and resin films composed of two or more layers of the resins listed above.

Film materials, such as polyethylene terephthalate (PET), polybutylene terephthalate, polyethylene naphthalate (PEN), and polycarbonates (PC), are preferred from the viewpoint of cost and availability. A heat-resistant transparent film having a basic skeleton of silsesquioxane with an organic-inorganic hybrid structure is preferred from the viewpoint of optical transparency, heat resistance, and adhesiveness to the constituent layers, such as the intermediate layer and the gas barrier layer.

If the gas barrier film 10 is, for example, used in a flexible electronic device in an electronic apparatus, the process temperature in an array production procedure may exceed 200° C. In a roll-to-roll process, a certain degree of tension is constantly applied to the substrate 11. Thus, if the substrate 11 is exposed to high temperatures exceeding the glass-transition temperature, the resilience of the substrate 11 suddenly decreases, and the substrate 11 is stretched due to the tension. This may cause damage to the gas barrier layer 14. Thus, in such a case, the substrate 11 is preferably composed of a heat-resistant resin material having a glass-transition temperature of 150° C. or higher. That is, the preferred material is a heat-resistant transparent film having a basic skeleton of polyimide, polyetherimide, or silsesquioxane with an organic-inorganic hybrid structure. Such heat-resistant amorphous resins have high water absorptivity compared to crystalline PET and PEN. Thus, the size of the substrate 11 significantly varies with humidity and may cause damage to the gas barrier layer 14. Even if the substrate 11 is composed of such a heat-resistant amorphous resin, gas barrier layers 14 formed on both sides of the substrate 11 can prevent the moisture absorption and desorption by the substrate 11 under severe high temperature and high humidity conditions. This configuration can reduce a variation in size of the substrate 11 and thus the damage to the gas barrier layers 14. Thus, in a preferred embodiment, the substrate 11 is composed of a heat-resistant resin material, and the gas barrier layers 14 are formed on both sides of the substrate 11.

The thickness of the substrate 11 is preferably in the range of approximately 5.0 to 500 μm, more preferably 25 to 250 μm.

The substrate 11 is preferably transparent. A transparent substrate 11 has a transmittance of 80% or higher in a visible light region (400 to 700 nm). If the substrate 11 and the gas barrier layer 14 and other layers formed over the substrate 11 are transparent, the gas barrier film 10 can transmit light. The light-transmissive substrate 11 can transmit the light emerging from organic EL elements and can transmit sun light to photovoltaic cells. Thus, the substrate 11 is suitable for a sealing film (transparent substrate) that seals organic EL elements and photovoltaic cells.

The substrate 11 composed of the resin materials described above may be an unstretched or stretched film.

The substrate 11 used for the present invention can be produced through a well-known procedure. For example, an unstretched substrate 11 that is substantially amorphous and not oriented can be produced by melting a material resin in an extruder, extruding the melted resin through a circular or T die, and quenching the resin.

A stretched substrate can be produced by stretching the unstretched substrate 11 through a known process, such as uniaxial stretching, successive biaxial stretching with a tenter, simultaneous biaxial stretching with a tenter, or a tubular simultaneous biaxial stretching, in the direction of the flow (longitudinal axis) of the substrate 11 and/or a direction orthogonal to the flow of the substrate 11 (lateral axis). In such a case, an appropriate stretching ratio can be selected in accordance with the constituent resin of the substrate 11. The stretching ratio in the longitudinal and lateral directions is preferably 2 to 10 times. A relaxing process is preferably performed after the stretching process to stabilize the size of the stretched film substrate 11.

Corona treatment may be carried out on the surface of the substrate 11 before the intermediate layer 12 and gas barrier layers 14 are formed over the substrate 11.

In particular, as described below, the gas barrier layer 14 according to the present invention can have a large thickness. Thus, the substrate 11 can be suitably used even if the 10-point average roughness Rz of the surface of the substrate 11, which is defined by JIS B 0601, is 200 nm or more. The surface roughness Rz of the substrate 11 may be within the range of 200 to 500 nm (inclusive). The surface roughness Rz of the substrate 11 is preferably within the range of 1 to 500 nm (inclusive), more preferably 5 to 400 nm (inclusive).

[Intermediate Layer]

The gas barrier film 10 according to the present invention may include at least one intermediate layer 12, which has various functions described below, disposed between the substrate 11 and the gas barrier layer 14. Similarly to the substrate 11, the intermediate layer 12 can be suitably used even if the 10-point average roughness Rz of the surface of the intermediate layer 12 is 200 nm or more. The surface roughness Rz of the intermediate layer 12 in contact with the gas barrier layer 14 may be within the range of 200 to 500 nm (inclusive). The surface roughness Rz of the intermediate layer 12 is preferably within the range of 1 to 500 nm (inclusive), more preferably 5 to 400 nm (inclusive).

The intermediate layer 12 may be, for example, an anchor coat layer, a smooth layer, or a primer layer.

(Anchor Coat Layer)

The intermediate layer 12 according to the present invention may be an anchor coat layer that has improved adhesion to the gas barrier layer 14.

The anchor coat layer is formed of an anchor coat agent composed of one or more of compounds, such as polyester resins, isocyanate resins, urethane resins, acrylic resins, ethylene-vinyl alcohol resins, vinyl-modified resins, epoxy resins, modified styrene resins, modified silicon resins, and alkyl titanates. The anchor coat agents may contain any well-known additive. The anchor coat layer can be formed by applying the anchor coat agent to a substrate through a known procedure, such as roll coating, gravure coating, knife coating, dip coating, or spray coating, and then drying the coating to remove the solvent or diluent.

The amount of anchor coat agent to be applied is preferably about 0.1 to 5 g/m² in the dry state.

The anchor coat layer can be formed through a gas phase process, such as physical deposition or chemical deposition. For example, as is described in Japanese Patent Application Laid-Open No. 2008-142941, an inorganic anchor coat layer primarily containing silicon oxide may be applied to improve adhesiveness. As described in Japanese Patent Application Laid-Open No. 2004-314626, an anchor coat layer may be formed to block gas generated at the substrate. In this way, a certain level of gas generated at the substrate can be blocked to control the composition of an inorganic thin film that is formed on the anchor coat layer through a gas phase process.

(Smooth Layer)

The intermediate layer 12 according to the present invention may be composed of a smooth layer that infills scoops to smoothen the surface of the substrate 11. In general, a layer with a smooth surface directly below and in contact with the gas barrier layer 14 is known to have superior gas barrier properties to a layer with a rough surface.

The smooth layer according to the present invention is prepared basically through the curing of a photosensitive material or a thermosetting material.

Examples of the photosensitive materials include resin compositions containing acrylate compounds having radically reactive unsaturated compounds, resin compositions containing acrylate compounds and mercapto compounds having thiol groups, and resin compositions containing dissolved polyfunctional acrylate monomers, such as epoxy acrylates, urethane acrylates, polyester acrylates, polyether acrylates, polyethylene glycol acrylate, and glycerol methacrylate. Any mixture of the resin compositions listed above can also be used. The resin composition may be any photosensitive resin containing reactive monomers having at least one photopolymerizable unsaturated bond per molecule.

Specific examples of thermosetting materials include TutoProm series (organic polysilazanes) manufactured by Clariant AG, SP Coat heat-resistant clear coating manufactured by Ceramic Coat Co., Ltd., nano hybrid silicone manufactured by Adeka Corp., Unidic V-8000 series and Epiclon EXA-4710 (ultra-high-heat-resistant epoxy resins) manufactured by DIC Co., Ltd., various silicon resins manufactured by Shin-Etsu Chemical Co., Ltd., inorganic-organic nanocomposite material SSG coat manufactured by Nitto Boseki Co., Ltd., thermosetting urethane resins consisting of acrylic polyols and isocyanate prepolymers, phenolic resins, urea-melamine resins, epoxy resins, unsaturated polyester resins, and silicon resins (polysiloxane, polysilsesquioxane). In particular, heat-resistant epoxy resin based and silicon resin-based materials are preferred.

A preferred process of forming a smooth layer is, but should not be limited to, wet coating such as spraying, blade coating, and dipping; or dry coating such as deposition.

During the formation of a smooth layer, additives, such as an antioxidant, an ultraviolet absorber, and/or a plasticizer, may be added to the photosensitive resin materials listed above, if required. Regardless of the position of the smooth layer in the laminate, appropriate resins and additives may be used in any smooth layer to improve the film formation and prevent pinholes.

For example, the smooth layer can be formed by mixing an additive with the materials listed above as appropriate, applying a coating solution, the concentration of which is adjusted with a diluent if necessary, to the surface of the substrate 11 through a known application process, drying the layer of coating solution, and then curing the dried layer by ionizing radiation or heat. The ionizing radiation can be performed through the emission of ultraviolet rays in the wavelength range of 100 to 400 nm, more preferably 200 to 400 nm, from a source, such as an ultra-high pressure mercury lamp, a high pressure mercury lamp, a low pressure mercury lamp, a carbon arc lamp, or a metal halide lamp or through the emission of electron beams in a wavelength range of 100 nm or below from a scanning or curtain electron beam accelerator.

The thickness of the smooth layer is preferably within the range of 1.0 to 10 µm, more preferably 2 to 7 µm, from the viewpoint of the adjustment of the optical characteristics of the film, such as balancing and curling.

The smoothness of the smooth layer indicated by the center line average roughness Ra defined by JIS B 0601 is preferably within the range of 0.5 to 12 nm (inclusive). In the present invention, a thick gas barrier layer 14 can be formed as described below. Thus, the smoothness of the smooth layer indicated by the 10-point average roughness Rz defined by JIS B 0601 may be within the range of 200 to 500 nm (inclusive). In general, the surface roughness Rz of the smooth layer is preferably within the range of 1 to 50 nm (inclusive).

The smooth layer may be provided on each side of the substrate 11.

[Bleed Preventing Layer]

If the gas barrier layer 14 is disposed on one side of the substrate 11 in the gas barrier film 10 according to the present invention, a bleed preventing layer 13 is preferably disposed on the surface, opposite from the gas barrier layer 14, of the substrate 11.

The bleed preventing layer 13 prevents the surface of the substrate 11 from contamination by unreacted oligomers migrating from the inside of the substrate 11 to the surface during heating. The bleed preventing layer 13 having such a function may basically be composed of the same materials and have the same configuration as the smooth layer described above.

The bleed preventing layer 13 may contain a matting agent as another additive. The matting agent is preferably composed of inorganic particles having an average particle size of approximately 0.1 to 5 µm. Such inorganic particles may be composed of one or more of silica, alumina, talc, clay, calcium carbonate, magnesium carbonate, barium sulfate, aluminum hydroxide, titanium dioxide, and zirconium oxide. The content of the matting agent composed of inorganic particles is preferably within the range of 2 to 20 parts by mass (inclusive), more preferably 6 to 16 parts by mass (inclusive) relative to 100 parts by mass of the entire bleed preventing layer.

[Gas Barrier Layer]

The gas barrier layer 14 according to the present invention is formed by irradiating a layer (film) containing polysilazane and the compound A defined in the present invention with vacuum ultraviolet rays. The gas barrier layer 14 can be formed, for example, through wet coating of a coating solution containing polysilazane and the compound A on the substrate 11 or the intermediate layer 12 disposed on the substrate 11, drying the solution to form a film, and modifying the film through the irradiation with vacuum ultraviolet rays. The modification of polysilazane refers to a reaction that converts all or part of the polysilazane compound to silicon oxide or silicon oxynitride.

The coating solution containing polysilazane can be applied to the substrate 11 through any appropriate procedure. Specifically, the coating solution may be applied through, for example, roll coating, flow coating, inkjet printing, spray coating, printing, dip coating, casting, bar coating, or gravure printing.

The thickness of the film can be selected in accordance with the intended use of the film. For example, the thickness of a dry film is preferably within the range of 50 nm to 2 µm (inclusive). The thickness is more preferably within the range of 100 nm to 1.5 µm (inclusive), most preferably 250 nm to 1 µm (inclusive).

Since a thick gas barrier layer 14 can be formed in the present invention, the preferred thickness of the gas barrier layer 14 is at least 250 nm for the purpose of covering the unevenness on the surfaces of the substrate 11 and the intermediate layer 12.

(Polysilazane)

"Polysilazane" according to the present invention refers to a polymer that has a structure including a silicon-nitrogen bond and is a precursor of silicon oxynitride. Preferred polysilazane has the following structure:

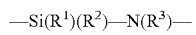

where $R^1$, $R^2$, and $R^3$ each represent a hydrogen atom, an alkyl group, an alkenyl group, a cycloalkyl group, an aryl group, an alkylsilyl group, an alkylamino group, or an alkoxy group.

According to the present invention, perhydropolysilazane in which $R^1$, $R^2$, and $R^3$ are all hydrogen atoms is particularly preferred to increase the density of the gas barrier layer 14.

Perhydropolysilazane is presumed to have a linear structure and a cyclic structure of mainly 6- and 8-membered rings. Perhydropolysilazane has a number average molecular weight (Mn) of approximately 600 to 2000 (polystyrene equivalent) and is in the form of liquid or solid depending on the molecular weight. Perhydropolysilazane is commercially available in the form of a solution of perhydropolysilazane dissolved in an organic solvent. A commercial product may be directly used as a coating solution containing polysilazane. Specific products of polysilazane solutions include NN120-20, NAX120-20, and NL120-20 manufactured by AZ Electronic Materials.

A preferred organic solvent used for the preparation of a coating solution containing polysilazane should not contain alcohols and water, which readily react with polysilazane.

Thus, examples of organic solvents to be used for the preparation of a coating solution containing polysilazane include hydrocarbon solvents, such as aliphatic hydrocarbon, alicyclic hydrocarbon, and aromatic hydrocarbon solvents; halogenated hydrocarbon solvents; and ethers, such as aliphatic ethers and alicyclic ethers. Specific examples include hydrocarbons, such as pentane, hexane, cyclohexane, toluene, xylene, Solvesso, and turpentine; halogenated hydrocarbons, such as methylene chloride and trichloroethane; and ethers, such as dibutyl ether, dioxane, and tetrahydrofuran.

These organic solvents may be selected in view of the solubility of polysilazane and/or the evaporation rate of the solvent. Mixtures of multiple organic solvents may also be used.

The concentration of polysilazane in the coating solution, which depends on the thickness of the target gas barrier layer 14 and the pot life of the coating solution, is approximately 0.2 to 35 mass %.

The coating solution containing polysilazane may contain an amine catalyst or a metal catalyst, such as a Pt compound (e.g., Pt acetylacetonate), a Pd compound (e.g., propionic acid Pd), or an Rh compound (e.g., Rh acetylacetonate) to promote the modification to a silicon oxide compound. Amine catalysts are most preferred in the present invention. Examples of the specific amine catalyst include N,N-diethylethanolamine, N,N-dimethylethanolamine, triethanolamine, triethylamine, 3-morpholinopropylamine, N,N,N',N'-tetramethyl-1,3-diaminopropane, and N,N,N',N'-tetramethyl-1,6-diaminohexane.

The amount of catalyst added to polysilazane is preferably in the range of 0.1 to 10 mass %, more preferably 0.2 to 5 mass %, most preferably 0.5 to 2 mass %. A catalyst added in such amounts can prevent the formation of excess silanol due to a rapid reaction, a decrease in the film density, and an increase in film defects.

(Compound A)

The compound A according to the present invention satisfies all of the following conditions (a), (b), and (c):
(a) the compound A has an Si—O bond and an organic group directly bonded to Si;
(b) the compound A has an Si—H group or an Si—OH group; and
(c) the compound A has a molecular weight of 90 or more and 1200 or less.

This indicates that the compound A is basically a siloxane compound or a silsesquioxane compound that has organic groups. This also indicates that the compound A contains reactive groups, such as Si—H groups and Si—OH groups, that can be bonded with a matrix of a composition $SiO_xN_y$ after the modification of polysilazane through the irradiation with VUV light while the organic groups are locally introduced.

The compound A that has a molecular weight in the range indicated above enables the formation of the gas barrier layer 14 containing uniformly dispersed nano-size regions to which the organic groups are introduced. The gas barrier layer 14 as a whole maintains excellent gas barrier properties because the regions containing the organic groups, which have inferior gas barrier properties, are dispersed and discontinuous in the gas barrier layer 14.

The addition of the compound A uniformly disperses the nano-size regions containing the organic groups in the gas barrier layer 14. Thus, the contraction of the entire gas barrier layer 14 can be uniformly alleviated during the modification of polysilazane through the irradiation with VUV light. As a result, cracking resistance can be established in the thick gas barrier layer 14 without the introduction of many organic groups and the impairment of the gas barrier properties. Such cracking resistance is effective even in a thin gas barrier layer 14. The gas barrier properties per unit thickness of the gas barrier layer are improved probably through the prevention of minute cracks and defects.

A compound without reactive Si—H and Si—OH groups does not react with the matrix of the gas barrier layer and readily evaporates during application and drying. Thus, the advantageous effects described above cannot be achieved. Such a compound also readily evaporates during VUV light irradiation and may contaminate the VUV irradiation apparatus. A compound containing reactive Si—OR groups is not preferred due to the ready reaction with polysilazane even in the coating solution and the low stability of the coating solution.

A compound A having a molecular weight exceeding 1200 causes some of the regions to which the organic groups are introduced in the gas barrier layer 14 to connect with each other and impair the gas barrier properties. A compound A having a molecular weight below 90 is gaseous at room temperature and readily evaporates during drying. Thus, the advantageous effects described above cannot be achieved.

The organic groups of the compound A preferably have, but not limited to, six or less carbon atoms in each organic group. Specifically, a preferred organic group is a methyl group, an ethyl group, or a phenyl group. The methyl group is especially preferred because of its size.

The gas barrier layer 14 contains the compound A within the range of 1 to 40 mass % (inclusive) with respect to the entire gas barrier layer 14. At 40 mass % or more, some of the regions to which the organic groups are introduced connect to each other in the gas barrier layer 14, impairing the gas barrier properties. Substantially no advantages are achieved below 1 mass %.

Specific examples of the compound A include organic siloxane compounds, which are described below. The average molecular weight of such organic siloxane compounds is in the range of 90 to 1200 (inclusive). The molecular weight is preferably distributed such that 90 mass % or more is within this range.

(Polysiloxane Having Si—H Ends)

An example of a polysiloxane having methyl groups, which are organic groups, and Si—H ends is represented by the following general formula (2). The organic groups may be other than methyl groups, such as phenyl groups, or may be a mixture of different organic groups.

[Formula 2]

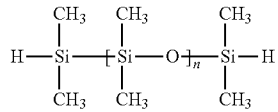

(2)

(Polysiloxane Having Si—OH Ends)

An example of a polysiloxane having methyl groups, which are organic groups, and Si—OH ends is represented by the following general formula (3). The organic groups may be other than methyl groups, such as phenyl groups, or may be a mixture of different organic groups.

[Formula 3]

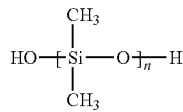

(3)

(Polysiloxane Having Si—H Side Chain(s))

An example of a polysiloxane having methyl groups, which are organic groups, and Si—H side chain(s) is represented by the following general formula (4). The organic groups may be other than methyl groups, such as phenyl groups, or may be a mixture of different organic groups.

[Formula 4]

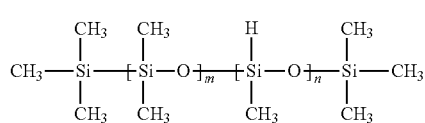

(4)

where m+n=100, and n represents a number from 1 to 100, preferably from 30 to 100, and most preferably 50 to 100.

Specific examples (S1 to S20) of the compound A are listed below together with their molecular weights (MW). The compound A preferably has a cyclic or cage structure including an Si—O—Si bond.

The compound A should not be limited to these examples (S1 to S20).

[Formula 5]

S1

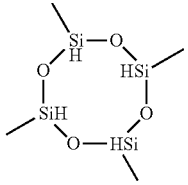

MW: 240.5

S2

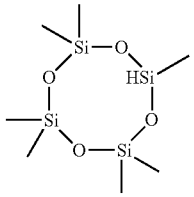

MW: 282.6

S3

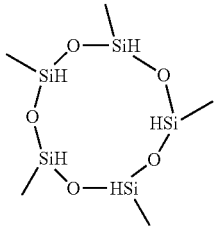

MW: 300.6

S4

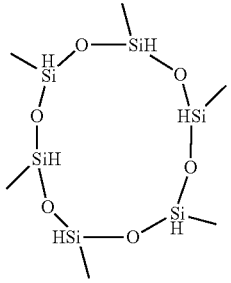

MW: 360.8

S5

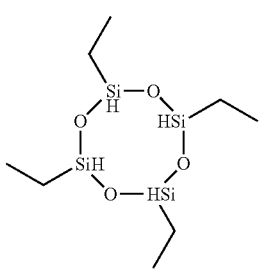

MW: 296.6

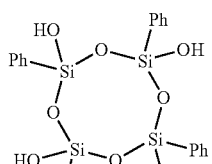
MW: 552.8
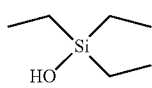
MW: 132.3
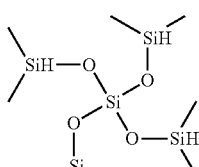
MW: 328.7
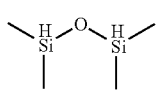
MW: 134.3
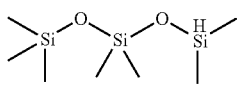
MW: 222.5
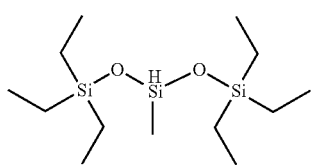
MW: 306.7
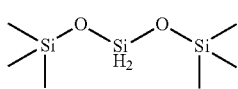
MW: 208.5
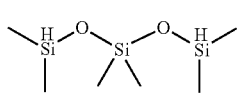
MW: 208.5
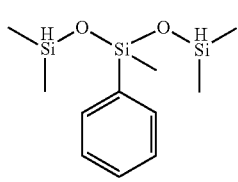
MW: 306.7
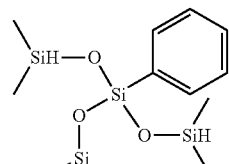
MW: 208.5
[Formula 6]
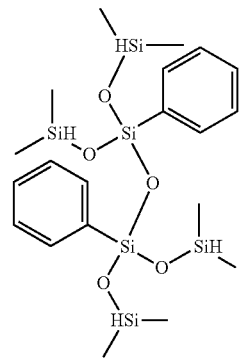
MW: 527.0
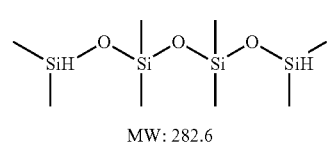
MW: 282.6
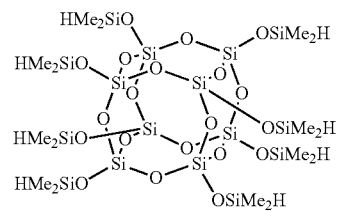
MW: 1018.2
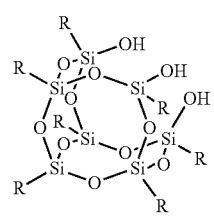
R = ethyl
MW: 595.0
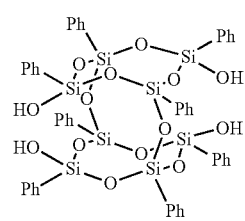
MW: 1069.5

A compound A according to a preferred embodiment of the present invention has a structure represented by the following general formula (1).

[Formula 7]

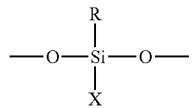

(1)

where R represents an organic group, and X represents H or OH.

If the compound A has a structure represented by the general formula (1), one of the valence electrons of Si is bonded to one organic group, and the remaining three valence electrons substantially form an Si—O—Si bond with the matrix in the gas barrier layer 14. Such a structure can introduce and disperse organic groups in minute regions. Thus, the gas barrier properties and cracking resistance are improved even more.

Preferably, 50% or more of the Si atoms in the compound A has a structure represented by the general formula (1), more preferably all of the Si atoms have this structure.

[Vacuum Ultraviolet Irradiation Process]

To form the gas barrier layer 14 according to the present invention, a film containing polysilazane and the compound A is irradiated with vacuum ultraviolet rays to modify at least some of the polysilazane molecules to silicon oxynitride molecules. At the same time, at least some of the polysilazane molecules bond to the reactive groups of the compound A. In this way, the gas barrier layer 14 is composed of a dense organic-inorganic composite layer with minute regions containing organic groups dispersed.

A presumed mechanism of the modification of the film containing polysilazane through vacuum ultraviolet irradiation into a specific composition $SiO_xN_y$ will be described with perhydropolysilazane as an example.

Perhydropolysilazane has a structure represented by $—(SiH_2—NH)_n—$. Perhydropolysilazane is also represented by $SiO_xN_y$, where x=0 and y=1.

An external oxygen source is required to achieve x>0. Examples of such external oxygen sources include (i) oxygen and water contained in the polysilazane coating solution; (ii) oxygen and water absorbed in the film from the atmosphere during application and drying; (iii) oxygen, water, ozone, and singlet oxygen absorbed in the film from the atmosphere during the vacuum ultraviolet irradiation; (iv) oxygen and water outgassed from the substrate and migrating into the film due to heat and other factors applied during the vacuum ultraviolet irradiation; and (v) oxygen and water migrating from a non-oxidizing atmosphere to an oxidizing atmosphere and then absorbed by the film during the vacuum ultraviolet irradiation in a non-oxidizing atmosphere.

The upper limit of y is basically one because it is presumed that the conditions for the nitridation of Si atoms are highly specific compared with those for oxidation.

Basically, x and y are defined as $2x+3y \leq 4$ on the basis of the number of valence electrons in Si, O, and N atoms. At y=0 after complete oxidation, the film contains silanol groups and x can satisfy $2<x<2.5$.

The presumed mechanism of the reaction that generates perhydropolysilazane through vacuum ultraviolet irradiation will now be described.

(I) Dehydrogenation and the Accompanying Formation of Si—N Bonds

Probably, the Si—H bonds and N—H bonds in perhydropolysilazane break relatively easily due to excitation induced by the vacuum ultraviolet irradiation to recombine as Si—N bonds under an inert atmosphere (dangling bonds may form in the Si atoms). That is, a cured film having a composition $SiN_y$ is formed without oxidation. In such a case, the polymer main chains are not broken. The breaking of the Si—H bonds and the N—H bonds is accelerated by a catalyst or heat. The released H is externally released in the form of $H_2$ from the film.

(II) Formation of Si—O—Si Bonds Involving Hydrolysis and Dehydration Condensation The Si—N bonds in perhydropolysilazane are hydrolyzed, the polymer main chains break, and Si—OH is formed. Two Si—OHs are condensed by dehydration condensation to form a cured Si—O—Si bond. Although such a reaction also occurs in the atmosphere, it is presumed that the main water source during the vacuum ultraviolet irradiation under an inert atmosphere is the water vapor outgassed from the substrate due to the heat generated by the irradiation. Excess water causes some Si—OHs to remain without dehydration condensation, and thus, a cured film having a composition $SiO_{2.1-2.3}$ acquires inferior gas barrier properties.

(III) Formation of Si—O—Si Bonds Involving Direct Oxidation by Singlet Oxygen

An appropriate amount of oxygen in the atmosphere during the vacuum ultraviolet irradiation forms highly oxidative singlet oxygen. H and N atoms in perhydropolysilazane are replaced with O atom to form Si—O—Si bonds and the film is cured. The breaking of the polymer main chains may also cause recombination of the bonds.

(IV) Oxidation Accompanying Breaking of Si—N Bonds Due to Vacuum Ultraviolet Irradiation and Excitation It is presumed that the energy of the vacuum ultraviolet rays, which is higher than the energy of the Si—N bonds in perhydropolysilazane, breaks the Si—N bonds and forms Si—O—Si bonds (or in some cases Si—O—N bonds) through oxidation if an oxygen source (such as oxygen, ozone, or water) is present in the environment. The breaking of the polymer main chains may also cause recombination of the bonds.

The composition of silicon oxynitride in the layer containing polysilazane irradiated with the vacuum ultraviolet rays can be adjusted by controlling the oxidation level through an appropriate combination of the oxidation mechanisms (I) to (IV).

In the vacuum ultraviolet irradiation process according to the present invention, the illuminance of the vacuum ultraviolet rays incident on the surface of the polysilazane film is preferably in the range of 30 to 200 $mW/cm^2$ (inclusive), more preferably 50 to 160 $mW/cm^2$ (inclusive). An illuminance below 30 $mW/cm^2$ may cause a significant decrease in the modification efficiency. An illuminance exceeding 200 $mW/cm^2$ may cause ablation on the film and damage to the substrate.

The irradiation energy of the vacuum ultraviolet rays incident on the surface of the polysilazane film is preferably in the range of 200 to 5000 $mJ/cm^2$ (inclusive), more preferably 500 to 3000 $mJ/cm^2$ (inclusive). An amount of energy below 200 $mJ/cm^2$ may result in unsatisfactory modification. An amount exceeding 5000 $mJ/cm^2$ may cause cracking due to excess modification and heat deformation of the substrate.

The vacuum ultraviolet source for the vacuum ultraviolet irradiation process is preferably a noble gas excimer lamp.

Noble gas is also referred to as inert gas because the atoms of noble gas, such as Xe, Kr, Ar, and Ne atoms, do not form molecules through chemical bonding. The atoms of the noble gas energized by a discharge (excited atoms) can bond with other atoms to form molecules. If the noble gas is xenon:

$e + Xe \rightarrow Xe^*$;

$Xe^* + 2Xe \rightarrow Xe_2^* + Xe$; and $Xe_2^* \rightarrow Xe + Xe + h\nu$ (172 nm). The excited excimer molecule $Xe_2^*$ returning to the ground state emits 172-nm excimer light (vacuum ultraviolet light).

An excimer lamp is highly efficient in that it radiates light of a single wavelength and does not substantially radiate light with other wavelengths. The target can be maintained at a low temperature because undesirable light is not emitted. The lamp can be turned on/off instantaneously because it can start or restart without startup time.

Excimer emission is achieved through a dielectric-barrier discharge. A dielectric-barrier discharge is a significantly narrow micro-discharge, similar to lightning, that is generated through a dielectric (transparent quartz in the case of an excimer lamp) disposed between electrodes in a gas space in response to the application of a high-frequency high-voltage of several tens of kilohertz to the electrodes. The microdischarge streamer reaching the tube wall (dielectric) charges the surface of the dielectric, and as a result, the micro-discharge vanishes. A dielectric-barrier discharge is the spread of micro-discharges over the entire tube wall through the repeated cycles of generation and vanishing. Thus, the flickering of light can be visually observed. Streamers of significantly high temperatures directly reach local points of the tube wall and may accelerate deterioration of the tube wall.

In addition to the dielectric-barrier discharge, excimer emission is also efficiently achieved through an electrodeless field discharge. An electrodeless field discharge occurs as a result of capacitive coupling and is also referred to as RF discharge. The lamp, the electrodes, and their arrangement are basically the same as those for the dielectric-barrier discharge. The high frequency applied to the electrodes illuminates the lamp at several MHz. Such a spatially or temporally uniform discharge achieved through an electrodeless field discharge provides a lamp having a long life without flickering.

A dielectric-barrier discharge generates micro-discharges only between the electrodes. Thus, for discharge over the entire discharge space the entire outer surface of the external electrode should be covered and the electrode should transmit light to radiate to the outside. Thus, the electrode is composed of a mesh of thin metal wires. The electrode is composed of very thin wires that do not block light. Unfortunately, the electrode is readily damaged in an oxygen atmosphere by ozone generated by vacuum ultraviolet rays. This can only be prevented by providing an inert gas atmosphere, such as a nitrogen atmosphere, around the lamp inside the irradiation apparatus and radiating the light through a window of synthetic quartz. The window of synthetic quartz is an expensive consumable and also has light loss.

The outer circumference of the double cylinder lamp is approximately 25 mm. The difference between the distance along the lamp axis to the irradiated surface and the distance from the side of the lamp to the irradiated surface is non-negligible, causing significant differences in illuminance. Thus, a uniform illuminance distribution cannot be achieved even by aligning multiple lamps in close contact with each other. An irradiation apparatus having a window of synthetic quartz can establish a uniform distance and a uniform illuminance distribution in an oxygen atmosphere.

An electrodeless field discharge does not require an external mesh electrode. An external electrode disposed on part of the external surface of the lamp spreads a glow discharge throughout the entire discharge space. The external electrode is typically composed of an aluminum block that also functions as a light reflector and is disposed on the back side of the lamp. The outer diameter of the lamp is large, similar to that for a dielectric-barrier discharge. Thus, synthetic quartz is required for a uniform illuminance distribution.

The greatest advantage of a narrow-tube excimer lamp is a simple structure. A gas used for excimer emission is sealed inside a quartz tube with closed ends. The outer diameter of the tube of the narrow-tube lamp is approximately 6 nm to 12 mm. A large diameter requires a high voltage for start-up.

The form of discharge may be either a dielectric-barrier discharge or an electrodeless field discharge. The contact surface of each electrode with the lamp may be flat. Alternatively, the contact surface of each electrode may be curved to conform to the surface of the lamp. In this way, the electrode firmly secures the lamp and tightly adheres to the lamp to stabilize the discharge. The curved surface may be composed of an aluminum mirror and function as a light reflector.

A Xe excimer lamp radiates ultraviolet rays having a short single wavelength of 172 nm and thus has excellent light emission efficiency. A large absorption coefficient to oxygen of such light generates a high concentration of oxygen radicals and ozone atoms from slight amounts of oxygen.

The light having a short wavelength of 172 nm has high energy that effectively breaks bonds of an organic substance. The high energy of active oxygen, ozone, and ultraviolet rays can modify the polysilazane layer within a short time.

Unlike low-pressure mercury lamps and plasma cleaning devices that generate light having wavelengths of 185 and 254 nm, an excimer lamp achieves an reduction in the process time required for high throughput, a reduction in the installation area, and achieves an irradiation of organic materials and plastic substrates, which are readily damaged by heat.

An excimer lamp has a high efficiency of light generation. Thus, the lamp can be illuminated with low electric power. An excimer lamp does not generate light having a long wavelength that causes temperature rise but radiates energy having a single wavelength in the ultraviolet region. This prevents a temperature rise at the surface of a target. Thus, an excimer lamp is suitable for use on flexible film materials, such as PET, which are readily affected by heat.

(Oxygen Concentration During Vacuum Ultraviolet (VUV) Irradiation)

Oxygen, which is required for the reaction in the vacuum ultraviolet irradiation process, absorbs vacuum ultraviolet rays. Thus, the irradiation with vacuum ultraviolet rays should be carried out in an atmosphere with low oxygen concentration to maintain the efficiency of ultraviolet irradiation.

In the present invention, the oxygen concentration during the vacuum ultraviolet (VUV) irradiation is preferably 10 to 10000 ppm (1%), more preferably 50 to 5000 ppm.

A dry inert gas atmosphere is preferred for the vacuum ultraviolet irradiation. A dry nitrogen gas atmosphere is preferred for its cost advantage. The oxygen concentration can be controlled by measuring the flow rates of the oxygen gas and the inert gas fed into the irradiation chamber and varying the ratio of the flow rates.

[Overcoat Layer]

The gas barrier film 10 according to the present invention may include an overcoat layer covering the gas barrier layer 14.

(Material for Overcoat Layer)

Preferred examples of the material for the overcoat layer include organic resins, such as organic monomers, oligomers, and polymers, and organic-inorganic composite resins containing monomers, oligomers, and polymers of siloxane and silsesquioxane having organic groups.

The organic resins and the organic-inorganic composite resins of the overcoat layer preferably have polymerizable groups and cross-linkable groups. The overcoat layer is preferably prepared by applying a resin composition coating solution containing an organic resin or an organic-inorganic composite resin and, if required, a polymerization initiator and/or a cross-linker; and curing the resulting film through light irradiation or heating.

A "cross-linkable group" can cross-link binder polymers through a chemical reaction that is triggered by light irradiation or heating. Examples of the chemical structures of groups having such functions include, but are not limited to, ethylenically unsaturated groups, which are polymerizable functional groups, and cyclic ether groups, such as epoxy groups and oxetanyl groups. The functional groups may transform into radicals through light irradiation. Examples of such cross-linkable groups include thiol groups, halogen atoms, and onium salt structures. Among them preferred are ethylenically unsaturated groups, which include the functional groups described in paragraphs [0130]-[0139] of Japanese Patent Application Laid-Open No. 2007-17948.

A preferred organic-inorganic composite resin is, for example, Ormocer, which is described in U.S. Pat. No. 6,503,634.

The structures of the organic resin and the organic-inorganic composite resin, the density of the polymerizable groups, the density of the cross-linkable groups, the ratio of the cross-linker and other additives, and the curing conditions can be appropriately adjusted to control the resilience of the overcoat layer to a predetermined value.

Examples of the organic resin compositions include resin compositions containing acrylate compounds having radically reactive unsaturated compounds, resin compositions containing acrylate compounds and mercapto compounds having thiol groups, and resin compositions containing dissolved polyfunctional acrylate monomers, such as, epoxy acrylates, urethane acrylates, polyester acrylates, polyether acrylates, polyethylene glycol acrylate, and glycerol methacrylate. Any mixture of the resin compositions listed above can also be used. The resin composition may be any photosensitive resin containing reactive monomers having at least one photopolymerizable unsaturated bond per molecule.

Examples of reactive monomers having at least one photopolymerizable unsaturated bond per molecule include methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethylhexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentenyl acrylate, 2-ethylhexyl acrylate, glycerol acrylate, glycidyl acrylate, 2-hydroxyethyl acrylate, 2-hydroxypropyl acrylate, isobornyl acrylate, isodecyl acrylate, isooctyl acrylate, lauryl acrylate, 2-methoxyethyl acrylate, methoxyethylene glycol acrylate, phenoxyethyl acrylate, stearyl acrylate, ethyleneglycol diacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyl trimethylolpropane triacrylate, pentaerythritol triacrylate, pentaerythritol tetraacrylate, ethylene oxide modified pentaerythritol triacrylate, ethylene oxide modified pentaerythritol tetraacrylate, propylene oxide modified pentaerythritol triacrylate, propylene oxide modified pentaerythritol tetraacrylate, triethylene glycol diacrylate, polyoxypropyl trimethylolpropane triacrylate, butyleneglycol diacrylate, 1,2,4-butanediol triacrylate, 2,2,4-trimethyl-1,3-pentanediol diacrylate, diallyl fumarate, 1,10-decanediol dimethyl acrylate, pentaerythritol hexaacrylate, the monomers listed above of which acrylate is replaced with methacryate, γ-methacryloxypropyltrimethoxysilane, and 1-vinyl-2-pyrrolidone.

The reactive monomers may consist of one type of reactive monomer, a mixture of two or more types of reactive monomers, or a mixture of reactive monomers and other compounds.

The composition of the photosensitive resin contains a photopolymerization initiator.

Examples of photopolymerization initiators may include combinations of photoreductive dyes and reductants, such as ascorbic acid and triethanolamine. Examples of the photoreductive dyes include benzophenone, methyl o-benzoylbenzoate, 4,4-bis(dimethylamino)benzophenone, 4,4-bis(diethylamino)benzophenone, α-aminoacetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyldimethylketal, benzylmethoxyethylacetal, benzoin methyl ether, benzoin butyl ether, anthraquinone, 2-tert-butylanthraquinone, 2-amylanthraquinone, β-chloroanthraquinone, anthrone, benzanthrone, dibenzosuberone, methyleneanthrone, 4-azidobenzylacetophenone, 2,6-bis(p-azidobenzylidene) cyclohexane, 2,6-bis(p-azidobenzylidene)-4-methylcyclohexanone, 2-phenyl-1,2-butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl [4-(methylthio)phenyl]-2-monopholino-1-propane, 2-benzyl-2-dimethylamino-1-(4-monopholinophenyl)-butanone-1, naphthalenesulfonyl chloride, quinolinesulfonyl chloride, n-phenyl thioacridone, 4,4-azobisisobutyronitrile, diphenyl disulfide, benzothiazole disulfide, triphenylphosphine, camphorquinone, tetrabromomethane, tribromophenylsulfone, benzoyl peroxide, eosin, and methylene blue. These photopolymerization initiators may be used alone or in combination.

The overcoat layer may contain inorganic materials. The addition of an inorganic material to the overcoat layer usually increases resilience. The resilience of the overcoat layer can be adjusted to a desirable value through the control of the content of the inorganic material.

The inorganic material preferably consists of inorganic particles having a number average particle size of 1 to 200 nm, more preferably 3 to 100 nm. The inorganic particles are preferably composed of metal oxides for transparency.

Examples of metal oxides include but are not limited to $SiO_2$, $Al_2O_3$, $TiO_2$, $ZrO_2$, ZnO, $SnO_2$, $In_2O_3$, BaO, SrO, CaO, MgO, $VO_2$, $V_2O_5$, $CrO_2$, $MoO_2$, $MoO_3$, $MnO_2$, $Mn_2O_3$, $WO_3$, $LiMn_2O_4$, $Cd_2SnO_4$, $CdIn_2O_4$, $Zn_2SnO_4$, $ZnSnO_3$, $ZnIn_2O_5$, $Cd_2SnO_4$, $CdIn_2O_4$, $Zn_2SnO_4$, $ZnSnO_3$, and $ZnIn_2O_5$. These metal oxides may be used alone or in combination.

Dispersions of the inorganic particles may be prepared in accordance with recent academic papers. Alternatively, commercially available inorganic particulate dispersions are also suitable. Specific examples of dispersions of various metal oxides include the Snow-Tex series and Organosilicasol manufactured by Nissan Chemical Industries, Ltd., the Nanobyk series manufactured by BYK Japan KK, and NanoDur manufactured by Nanophase Technologies Corporation.

The surfaces of the inorganic particles may be processed before its use.

Examples of the inorganic material include flat microparticles of micas, such as natural mica and synthetic mica, talc represented by $3MgO.4SiO.H_2O$, taeniolite, montmorillonite, saponite, hectorite, and zirconium phosphate. Specifically, natural micas include muscovite, paragonite, phlogopite, biotite, and lepidolite. Examples of synthetic micas include nonswelling micas, such as fluorophlogopite KMg3 (AlSi3O10)F2 and K-tetrasilicicmica (KMg2.5Si4O10)F2, and swelling micas, such as Na-tetrasilicic mica NaMg2.5 (Si4O10)F2, Na or Li taeniolite (Na,Li)Mg2Li(Si4O10)F2, and Na or Li hectorite (Na,Li)1/8Mg2/5Li1/8(Si4O10)F2 belonging to the montmorillonite system. Synthetic smectite may also be used.

The content of the inorganic material in the entire overcoat layer is preferably within the range of 10 to 95 mass %, more preferably 20 to 90 mass %.

The overcoat layer may contain a coupling agent alone or in a combination of a coupling agent with any other material. Examples of coupling agents include but are not limited to silane coupling agents, titanate coupling agents, aluminate coupling agents. Silane coupling agents are preferred for the stability of the coating solution.

Specific examples of the silane coupling agents include silane coupling agents containing halogen atoms (e.g., 2-chloroethyltrimethoxysilane, 2-chloroethyltriethoxysilane, 3-chloropropyltrimethoxysilane, and 3-chloropropyltriethoxysilane), silane coupling agents containing epoxy groups (e.g., 2-(3,4-epoxycyclohexyl)ethyltrimethoxysilane, 2-(3,4-epoxycyclohexyl)ethyltriethoxysilane, 3-(3,4-epoxycyclohexyl)propyltrimethoxysilane, 2-glycidyloxyethyltrimethoxysilane, 2-glycidyloxyethyltriethoxysilane, 3-glycidyloxypropyltrimethoxysilane, and 3-glycidyloxypropyltriethoxysilane), silane coupling agents containing amino groups (e.g., 2-aminoethyltrimethoxysilane, 3-aminopropyltrimethoxysilane, 3-aminopropyltriethoxysilane, 2-[N-(2-aminoethyl)amino]ethyltrimethoxysilane, 3-[N-(2-aminoethyl)amino]propyltrimethoxysilane, 3-[(2-aminoethyl)amino]propyltriethoxysilane, and 3-[N-(2-aminoethyl)amino]propylmethyldi methoxysilane), silane coupling agents containing mercapto groups (e.g., 2-mercaptoethyltrimethoxysilane, 3-mercaptopropyltrimethoxysilane, and 3-mercaptopropyltriethoxysilane), silane coupling agents containing vinyl groups (e.g., vinyltrimethoxysilane and vinyltriethoxysilane), and saline coupling agents containing (meth)acryloyl groups (e.g., 2-methacryloyloxyethyltrimethoxysilane, 2-methacryloyloxyethyltriethoxysilane, 2-acryloyloxyethyltrimethoxysilane, 3-methacryloyloxypropyltrimethoxysilane, 3-methacryloyloxypropyltriethoxysilane, and 3-acryloyloxypropyltrimethoxysilane). These silane coupling agents may be used alone or in combination.

The overcoat layer is preferably formed by applying a coating solution of the organic resins, the inorganic resins, and other optional components as appropriate in solvent onto the surface of a substrate by a known procedure, and then curing the resulting film through irradiation with ionizing radiation. The ionizing radiation can be performed through the emission of ultraviolet rays in the wavelength range of 100 to 400 nm, preferably 200 to 400 nm, from a source, such as an ultra-high pressure mercury lamp, a high pressure mercury lamp, a low pressure mercury lamp, a carbon arc lamp, or a metal halide lamp or through the emission of electron beams in a wavelength range of 100 nm or below from a scanning or curtain electron beam accelerator.

<Use of Gas Barrier Film>

The gas barrier film 10 according to the present invention may be applied to film substrates and sealing films mainly for packages of electronic devices, such as organic EL elements, liquid crystal display elements, and organic photoelectric conversion elements (photovoltaic cell elements).

An example electronic apparatus including a gas barrier film 10 according to the present invention will now be described by a photovoltaic cell including an organic photoelectric conversion element.

<Organic Photoelectric Conversion Element and Photovoltaic Cell>

A photovoltaic cell includes an organic photoelectric conversion element, which is an electronic device, and a gas barrier film 10 sealing the organic photoelectric conversion element. The gas barrier film 10 in the photovoltaic cell is preferably transparent and serves as a substrate (or support) having a surface to receive sun light.

For example, a resin support for an organic photoelectric conversion element is formed by disposing a transparent electrode or transparent conductive thin film, such as ITO, on the gas barrier film 10 according to the present invention.

A porous semiconductor layer (power generating layer) is then formed on the transparent electrode or anode disposed on the resin support for the organic photoelectric conversion element, and a cathode of metal film is provided on the porous semiconductor layer, to form an organic photoelectric conversion element including the anode, the porous semiconductor layer, and the cathode. Another sealing material (which may be identical to the gas barrier film) is overlaid on the organic photoelectric conversion element to bond the resin support for the organic photoelectric conversion element and its periphery to seal the organic photoelectric conversion element. A photovoltaic cell is thus formed. A sealed organic photoelectric conversion element is not affected by external moisture and gases such as oxygen.

The resin support for the organic photoelectric conversion element is formed by disposing a transparent conductive film (transparent electrode) on a ceramic layer (which is a silicon oxide layer or silicon oxynitride layer composed of modified polysilazane, in this case) of the gas barrier film 10.

The transparent conductive film can be formed through vacuum deposition, sputtering, or application process, such as a sol-gel process using metal alkoxides of, for example, indium or tin. The transparent conductive film preferably has a thickness in the range of 0.1 to 1000 nm.

<Configuration of Organic Photoelectric Conversion Element and Photovoltaic Cell>

The constituent layers of the organic photoelectric conversion element and preferred embodiments of the organic photoelectric conversion element and the photovoltaic cell will now be described. A preferred embodiment of the organic photoelectric conversion element will now be described in detail. The same description is applicable to a photovoltaic cell, which is an electronic apparatus including an organic photoelectric conversion element sealed with a gas barrier film as a component.

The organic photoelectric conversion element should at least include an anode, a cathode, and one or more power generating layers (which is also referred to as a layer composed of a mixture of p-type and n-type semiconductors, a bulk heterojunction layer, or an i layer) disposed between the anode and the cathode and should generate an electric current upon reception of light.

Preferred examples of the layer configuration of the organic photoelectric conversion element (the layer configuration of a photovoltaic cell) will now be described; however, the present invention should not be limited to these configurations.

(1) Anode (first electrode)/power generating layer/cathode (second electrode);

(2) Anode/positive-hole transport layer/power generating layer/cathode;

(3) Anode/positive-hole transport layer/power generating layer/electron transport layer/cathode;

(4) Anode/positive-hole transport layer/p-type semiconductor layer/power generating layer/n-type semiconductor layer/electron transport layer/cathode; and (5) Anode/positive-hole transport layer/first power generating layer/electron transport layer/intermediate electrode/positive-hole transport layer/second power generating layer/electron transport layer/cathode.

The power generating layer should contain a p-type semiconductor material that can transport positive holes, and an n-type semiconductor material that can transport electrons. The p-type semiconductor material and the n-type semiconductor material in the power generating layer may have a substantially two-layer heterojunction configuration or a bulk heterojunction configuration in which the p-type and n-type semiconductor materials are mixed in a single layer. The bulk heterojunction configuration is preferred for highly efficient photoelectric conversion. The p-type semiconductor material and the n-type semiconductor material in the power generating layer will be described below.

A preferred configuration ((3)) includes a power generating layer disposed between a positive-hole transport layer and an electron transport layer. This enables the anode and the cathode to efficiently extract holes and electrons, respectively. Alternatively, the power generating layer may be disposed between a layer composed of a p-type semiconductor material alone and a layer composed of an n-type semiconductor material alone, such as in the configuration (4) (which is referred to as "p-i-n configuration"), for enhanced rectification of holes and electrons (selection of carrier extraction) by the power generating layer. Alternatively, power generating layers may have a tandem configuration (configuration (5)) in which the power generating layers absorb sun light beams of different wavelengths to enhance the use efficiency of the sun light.

The materials for these layers will now be described.
(Material for Organic Photoelectric Conversion Element)

The power generating layer (also referred to as "photoelectric conversion layer") of the organic photoelectric conversion element is composed of p-type and n-type semiconductor materials.

<P-type Semiconductor Material>

Preferred examples of p-type semiconductor materials for the power generating layer (bulk heterojunction layer) of the organic photoelectric conversion element include various fused polycyclic aromatic low-molecular compounds and conjugated polymers and oligomers.

Examples of fused polycyclic aromatic low-molecular compounds include anthracene, tetracene, pentacene, hexacene, heptacene, chrysene, picene, fulminene, pyrene, peropyren, perylene, terylene, quoterylene, coronene, ovalene, circumanthracene, bisantene, zethrene, heptazethrene, pyranthrene, violanthrene, isoviolanthrene, circobiphenyl, and anthradithiophene; porphyrin, copper phthalocyanine, a tetrathiafulvalene (TTF)-tetracyanoquinodimethane (TCNQ) complex, and a bis(ethylene)tetrathiafulvalene (BEDTTTF)-perchloric acid complex; and the derivatives and precursors thereof.

Examples of derivatives containing fused rings include pentacene derivatives containing substituents, such as those described in WO 03/16599, WO 03/28125, U.S. Pat. No. 6,690,029, and Japanese Patent Application Laid-Open No. 2004-107216; a pentacene precursor described in U.S. Unexamined Patent Application Publication No. 2003-136964; and acene compounds substituted by trialkylsilylethynyl groups, which are described in J. Amer. Chem. Soc., Vol. 127. No. 14. 4986, and J. Amer. Chem. Soc., Vol. 123, p. 9482, J. Amer. Chem. Soc., Vol. 130 (2008), No. 9, 2706.

Examples of conjugated polymers and oligomers include polythiophenes, such as poly(3-hexylthiophene) (P3HT), and their oligomers; polythiophene containing polymerizable groups described in Technical Digest of the International PVSEC-17, Fukuoka, Japan, 2007, p. 1225; a polythiophene-thienothiophene copolymer described in Nature Material, (2006) Vol. 5, p. 328; polythiophene-diketopyrrolopyrrole copolymers described in WO 08/000,664; polythiophene-thiazolothiazole copolymers described in Adv. Mater, 2007, p. 4160; polythiophene copolymers, such as PCPDTBT described in Nature Mat. Vol. 6 (2007), p. 497; polypyrrole and its oligomers; polyaniline, polyphenylene and their oligomers; polyphenylene vinylene and its oligomers; polythienylene vinylene and its oligomer; and polymer materials, such as σ conjugated polymers, including polyacetylene, polydiacetylene, polysilane, and polygermane.

Preferred oligomer materials, other than polymer materials, include α-sexithiophenes, which are thiophene hexamers, α,ω-dihexyl-α-sexithiophenes, α,ω-dihexyl-α-quinquethiophenes, and α,ω-bis(3-butoxypropyl)-α-sexithiophenes.

A preferred compound among these compounds has solubility to organic solvents sufficient for solution processing, forms a crystalline thin film after dried, and achieves high mobility (mobility of electrons and positive holes).

If an electron transport layer is formed on a power generating layer through a coating process, the solution of the electron transport layer dissolves the power generating layer. Thus, it is preferred to select materials that can be insolubilized after being applied through a solution process. Examples of such materials include materials that are polymerized, cross-linked, and insolubilized after application, such as polythiophenes having polymerizable groups, which are described in Technical Digest of the International PVSEC-17, Fukuoka, Japan, 2007, p. 1225; or materials having soluble substituents that are insolubilized through a reaction of soluble substituents by energy such as heat (pigmentation), which is described in U.S. Unexamined Patent Application Publication No. 2003-136964 and Japanese Patent Application Laid-Open No. 2008-16834.

<N-type Semiconductor Material>

Examples of the n-type semiconductor materials for a power generating layer (bulk heterojunction layer) include but are not limited to fullerenes and octaazaporphyrins; perfluoro-modified p-type semiconductors on which hydrogen atoms are replaced with fluorine atoms (e.g., perfluoropentacene and perfluorophthalocyanine); aromatic carboxylic acid anhydrides, such as naphthalenetetracarboxylic acid anhydrides, naphthalenetetracarboxylic acid diimides, perylenetetracarboxylic acid anhydride, and perylenetetracarboxylic acid diimides; and polymers having imides as skeletons.

A fullerene derivative is particularly preferred for the fast (below 50 fs) and efficient charge separation with various p-type semiconductor materials. Examples of fullerene derivatives include fullerene C60, fullerene C70, fullerene C76, fullerene C78, fullerene C84, fullerene C240, fullerene C540, mixed fullerenes, fullerene nanotubes, multilayer nanotubes, monolayer nanotubes, nanohorns (cones), and fullerene derivatives having parts replaced with hydrogen atoms, halogen atoms, or substituted/nonsubstituted alkyl, alkenyl, alkynyl, aryl, heteroaryl, cycloalkyl, silyl, ether, thioether, and amino groups.

Among the fullerene derivatives, fullerene derivatives that have substituents to enhance the solubility are preferred. Examples of such fullerene derivatives include [6,6]-phenyl-C61-butyric acid methyl ester (PCBM), [6,6]-phenyl-C61-butyric acid n-butyl ester (PCBnB), [6,6]-phenyl-C61-butyric acid isobutyl ester (PCBiB), and [6,6]-phenyl-C61-butyric acid n-hexyl ester (PCBH); bis-PCBM described in Adv. Mater., Vol. 20 (2008), p. 2116; aminated fullerenes described in Japanese Patent Application Laid-Open No. 2006-199674; metallocene-doped fullerenes described in Japanese Patent Application Laid-Open No. 2008-130889; and fullerenes having cyclic ether groups described in U.S. Pat. No. 7,329,709.

(Positive-Hole Transport Layer and Electron Blocking Layer)

An organic photoelectric conversion element includes a positive-hole transport layer disposed between a power generating layer (bulk heterojunction layer) and an anode to improve the efficiency of the extraction of electric charges emerging from the power generating layer.

Examples of materials for the positive-hole transport layer include PEDOT (poly-3,4-ethylenedioxythiophene), such as BaytronP manufactured by Starck-V Tech Ltd.; polyanilines and their dopants; and cyanogen compounds described in WO 06/19270.

A positive-hole transport layer having a LUMO level lower than that of the n-type semiconductor material for the power generating layer has a rectifying effect that blocks electrons emerging from the power generating layer from entering the anode. Such a positive-hole transport layer having an electron blocking function is referred to as an electron blocking layer and is preferred. Examples of materials for the electron blocking layer include triarylamines, which are described in Japanese Patent Application Laid-Open No. 5-271166, and metal oxides, such as molybdenum oxide, nickel oxide, and tungsten oxide.

The positive-hole transport layer may be composed of a p-type semiconductor material alone, which is also used for the power generating layer.

The positive-hole transport layer (electron blocking layer) may be formed through vacuum deposition or solution coating. The solution coating is preferred. It is preferred to form a primer film before the power generating layer is formed to level the surface to be coated and reduce the leakage.

(Electron Transport Layer and Positive-Hole Blocking Layer)

The organic photoelectric conversion element includes an electron transport layer disposed between a power generating layer (bulk heterojunction layer) and a cathode to improve the efficiency of the extraction of electric charges emerging from the power generating layer.

Examples of materials for the electron transport layer include octaazaporphyrin and perfluoro-modified p-type semiconductors (e.g., perfluoropentacene and perfluorophthalocyanine).

An electron transport layer having a HOMO level higher than that of a p-type semiconductor material for the power generating layer has a rectifying effect that blocks positive holes emerging from the power generating layer from entering the cathode. Such an electron transport layer having a positive-hole blocking function is referred to as a positive-hole blocking layer and is preferred. Examples of materials for the positive-hole blocking layer include phenanthrenes, e.g., bathocuproine; n-type semiconductor materials, e.g., naphthalenetetracarboxylic acid anhydrides, naphthalenetetracarboxylic acid diimides, perylenetetracarboxylic acid anhydrides, and perylenetetracarboxylic acid diimides; n-type inorganic oxides, e.g., titanium oxide, zinc oxide, and gallium oxide; and alkali metal compounds, e.g., lithium fluoride, sodium fluoride, and cesium fluoride.

The electron transport layer may be composed of an n-type semiconductor material alone, which is also used for the power generating layer.

The electron transport layer (positive-hole blocking layer) may be formed through vacuum deposition or solution coating. The solution coating is preferred.

(Transparent Electrode (First Electrode))

Although a transparent electrode can be used as any of a cathode and an anode depending on the configuration of the element, it is suitably used as an anode. For example, a transparent electrode used as an anode is preferably composed of a material that transmits light of 380 to 800 nm. Examples of such materials include transparent conductive metal oxides, such as indium tin oxide (ITO), $SnO_2$, and ZnO; metal thin films composed of gold, silver, and platinum; and metal nanowires and carbon nanotubes. More examples include conductive polymers selected from a group consisting of derivatives of polypyrrole, polyaniline, polythiophene, polythienylene vinylene, polyazulene, polyisothianaphthene, polycarbazole, polyacetylene, polyphenylene, polyphenylene vinylene, polyacene, polyphenylacetylene, polydiacetylene, and polynaphthalene. The transparent electrode may be composed of a combination of multiple conductive compounds.

(Counter Electrode (Second Electrode))

The cathodic counter electrode may be composed of a conductive material alone or a combination of conductive materials and resins providing support. The conducting material of the counter electrode is composed of electrode materials having a small work function (4 eV or less), such as metals, alloys, electroconductive compounds, and mixtures of these.

Examples of such electrode materials include sodium, alloys of sodium and potassium, magnesium, lithium, mixtures of magnesium and copper, mixtures of magnesium and silver, mixtures of magnesium and aluminum, mixtures of magnesium and indium, mixtures of aluminum and aluminum oxide ($Al_2O_3$), indium, mixtures of lithium and aluminum, and rare-earth metals.

Among them, mixtures of these primary metals and secondary metals, which are stable metals having a work function larger than that of the primary metals, are preferred for their electron extraction ability and oxidation resistance; examples of such mixtures include mixtures of magnesium and silver, magnesium and aluminum, magnesium and indium, aluminum and aluminum oxide ($Al_2O_3$), and lithium and aluminum.

The counter electrode can be composed of such an electrode material formed into a thin film through deposition or sputtering. The film usually has a thickness in the range of 10 nm to 5 µm, preferably 50 to 200 nm.

A counter electrode having a conductive material composed of metal reflects the light incident on the counter electrode toward the first electrode. The reflected light is absorbed at the photoelectric conversion layer for reuse. This advantageously increases the efficiency of photoelectric conversion.

The counter electrode may be composed of metals (such as gold, silver, copper, platinum, rhodium, ruthenium, aluminum, magnesium, and indium), and nanoparticles, nanowires, and nanostructures, which are composed of carbon. A dispersion of nanowires is preferred for the formation of a highly conductive transparent counter electrode through a coating process.

A light-transmissive counter electrode can be composed of conductive materials suitable for a counter electrode, such as aluminum, aluminum alloys, silver, and silver compounds. The light-transmissive counter electrode can be produced by forming a film of such a conductive material having a thickness of approximately 1 to 20 nm and then, forming another film composed of a light-transmissive, conductive material, which is listed above in the description of the transparent electrode.

(Intermediate Electrode)

The preferred material for the intermediate electrode, which is required for an organic photoelectric conversion element having a tandem layer configuration (configuration (5)), is a compound having both transparency and conductivity. Examples of such a compound include the materials listed above for the transparent electrode (for example, transparent metal oxides, such as ITO, AZO, FTO, and titanium oxide; significantly thin metal layers composed of, for example, Ag, Al, and Au; layers containing nanoparticles and nanowires; and conductive polymers, such as PEDOT: PSS and polyaniline).

Some of the positive-hole transport layers and electron transport layers described above may be appropriately combined to form a laminate that functions as an intermediate electrode (charge recombination layer). Such a layer configuration is preferred because it allows the omission of a step of forming one of the layers.

(Metal Nanowire)

Examples of conductive fibers used as a material for the electrodes include organic and inorganic fibers coated with metal, conductive metal oxide fiber, metal nanowire, carbon fiber, and carbon nanotubes. The preferred material is metal nanowire. In general, a metal nanowire is a linear structure mainly composed of a metal element. The metal nanowire in the present invention refers to a linear structure having a diameter on the nanometer order.

For a single metal nanowire to establish a long conductive path and appropriate light scattering, the metal nanowire preferably has an average length of 3 µm or more, more preferably 3 to 500 µm, most preferably 3 to 300 µm. The preferred relative standard deviation of length is 40% or less.

A small average diameter is preferred for transparency, whereas a large diameter is preferred for conductivity. In the present invention, the metal nanowire preferably has an average diameter of 10 to 300 nm, more preferably 30 to 200 nm. The preferred relative standard deviation of diameter is 20% or less.

The metal nanowire may be composed of, but is not limited to, one or more of noble metals and base metals. The metal nanowire is preferably composed of at least one metal selected from the group consisting of noble metals (e.g., gold, platinum, silver, palladium, rhodium, iridium, ruthenium, and osmium), iron, cobalt, copper, and tin. Silver is preferably included for its conductivity.

For the compatibility of conductivity and stability (resistance to sulfuration and oxidation and resistance to migration), the metal nanowire preferably contains silver and at least one noble metal other than silver. If the metal nanowire of the present invention contains two or more metal elements, the metal nanowire may have different metal compositions between the surface and the interior or have a homogeneous metal composition over the entire nanowire.

Metal nanowires can be produced through any known process, such as a liquid phase process or a gas phase process. Any known method of production may also be employed.

For example, a method of producing Ag nanowire is described in Adv. Mater., 2002, 14, 833-837 and Chem. Mater., 2002, 14, 4736-4745; a method of producing Au nanowire is described in Japanese Patent Application Laid-Open No. 2006-233252; a method of producing Cu nanowire is described in Japanese Patent Application Laid-Open No. 2002-266007; and a method of producing Co nanowire is described in Japanese Patent Application Laid-Open No. 2004-149871. In particular, the method of producing Ag nanowire reported in Adv. Mater. and Chem. Mater. is preferred because of the ready production of the Ag nanowire in a water system and the highest conductivity of silver among metals.

A three-dimensional conductive network constructed with metal nanowires in contact with each other has high conductivity, allows light transmission through windows or openings formed in the conductive network, and achieves effective power generation at the organic power generating layer due to the scattering effect of the metal nanowires. In a preferred embodiment, the metal nanowire in the first electrode is disposed near the organic power generating layer to enhance the scattering effect.

(Optically Functional Layer)

An organic photoelectric conversion element may include various optically functional layers for the effective reception of sun light. Examples of optically functional layers include an anti-reflection layer, a light-collecting layer, such as a microlens array, and a light-scattering layer that scatters light reflected at the cathode such that the light re-enters the power generating layer.

Any known anti-reflection layer may be selected. If an anti-reflection layer provided on a transparent resin film (gas barrier film 10) is composed of a biaxially stretched polyethylene terephthalate film, it is preferred to adjust the refractive index of a readily adhesive layer adjoining the film to 1.57 to 1.63 so as to reduce the reflection at the interface of the film and the readily adhesive layer and enhance the transmittance. The refractive index can be adjusted by applying a mixture of an oxide sol having a relatively large refractive index, such as tin oxide sol or cerium oxide sol, and a binder resin in an appropriate ratio. The readily adhesive layer may have a single-layer configuration or may have a multilayer configuration for the enhancement of the adhesiveness.

The light-collecting layer may be a combination of a support substrate (gas barrier film 10) with a microlens array structure receiving sun light or with a light-collecting sheet. The light-collecting layer increases the amount of light received from a specific direction or, in contrast, decreases the dependency of the reception of sun light on its incident angle. An example microlens array includes a two-dimensional array of square pyramids having a 30-μm sides and a 90-degree apex disposed on the light extracting side of the substrate. Each side of a square pyramid preferably has a length in the range of 10 to 100 μm. Shorter sides are not preferred because colors are generated as a result of diffraction, whereas larger sides are not preferred because of an increase in thickness.

Examples of light-scattering layers include various anti-glare layers and colorless transparent polymer layers containing dispersants, such as nanoparticles or nanowires composed of metals or various inorganic oxides.

(Other Layers)

An organic photoelectric conversion element may include various intermediate layers for the enhancement of the energy conversion efficiency and the extension of the service life of the element. Examples of the intermediate layer include a positive-hole blocking layer, an electron blocking layer, a positive-hole injecting layer, an electron injecting layer, an exciter blocking layer, an UV absorbing layer, a light-reflecting layer, and a wavelength converting layer.

(Method of Forming Film and Method of Processing Surface)

Examples of processes for producing power generating layers (bulk heterojunction layers) composed of a mixture of electron receptors and electron donors, electrodes, and various other layers include deposition and coating (including casting and spin coating).

Examples of processes for producing a power generating layer include deposition and coating (including casting and spin coating). Coating is preferred for producing an element having enhanced photoelectric conversion efficiency through an increase in the area of the interface, at which positive holes and electrons are charge-separated. Coating is advantageous for high-rate production.

Examples of application processes for producing a power generating layer include, but are not limited to, spin coating, solution casting, dip coating, blade coating, wire-bar coating, gravure coating, and spray coating. The power generating layer may also be patterned through a printing process, such as inkjet printing, screen printing, relief printing, intaglio printing, offset printing, and flexo printing.

After the application, it is preferred to apply heat for the removal of residual solvent, moisture, and gas and for mobility enhancement and the shift of absorbing wavelengths to a longer region through the crystallization of the semiconductor material. Annealing of the power generating layer at a predetermined temperature during the production process promotes the formation of microscopic aggregations or crystallizations in portions of the power generating layer, providing the bulk heterojunction layer with an appropriate phase separation structure. As a result, the carrier mobility in the bulk heterojunction layer increases to achieve high power generating efficiency.

The power generating layer (bulk heterojunction layer) may be composed of a single layer containing a homogeneous mixture of electron receptors and electron donors. Alternatively, the power generating layer may be composed of multiple layers having different mixing ratios of electron receptors and electron donors. In such a case, a material that can be insolubilized after application as described above should be selected.

(Patterning)

Any known procedure and process may be applied to the patterning of electrodes, power generating layers, positive-hole transport layers, and electron transport layers.

A soluble material, which is used to form the bulk heterojunction layer, the transport layers, and other layers, is patterned by applying the material on the entire surface through die coating or dip coating and then removing it in the unnecessary sections. Alternatively, the material can be directly patterned during application through a process, such as inkjet printing or screen printing.

An insoluble material, which is used to form the electrode, is patterned through mask deposition during vacuum deposition or through a known process, such as etching or lift-off. Patterning can also be performed by transferring a pattern prepared on a separate substrate.

EXAMPLES

Specific examples of the gas barrier film according to the present invention will now be described in detail. The present invention, however, should not be limited to these examples. The term "part" and the sign "%" used in the examples respectively refer to "part by mass" and "mass %," unless otherwise specified.

Example 1

<<Production of Barrier Substrates>>
[Production of Barrier Substrate (a)]

A bleed preventing layer was formed on one side and a smooth layer was formed on the other side of a thermoplastic resin substrate (substrate 11) composed of a 125-μm thick polyester film (super-low heat shrinkage PET Q83 manufactured by Teijin DuPont Films Ltd.), the two sides of which were subjected to an adhesive enhancing process, as described below, to give a barrier substrate (a).

<Formation of Bleed Preventing Layer>

A UV-curable organic-inorganic hybrid hard coating material OPSTAR 27535 manufactured by JSR Corporation was applied to one side of the thermoplastic resin substrate (substrate 11) into a dry thickness of 4.0 μm, the coating material was dried at 80° C. for three minutes, and the coating material was cured by irradiation with light having an irradiation energy of 1.0 J/cm$^2$ from a high-pressure mercury lamp in air, to form a bleed preventing layer.

<Formation of Smooth Layer>

A UV-curable organic-inorganic hybrid hard coating material OPSTAR 27501 manufactured by JSR Corporation was applied to a surface, opposite from the bleed preventing layer, of the thermoplastic resin substrate (substrate 11) into a dry thickness of 4.0 μm, the coating material was dried at 80° C. for three minutes, and the coating material was cured by irradiation with light having an irradiation energy of 1.0 J/cm$^2$ from a high-pressure mercury lamp in air, to form a smooth layer.

The surface roughness Ra of the resulting smooth layer measured through a procedure in accordance with JIS B 0601 was 1 nm. The surface roughness Rz was 20 nm.

The surface roughnesses were measured with an AFM (atomic force microscope) SPI3800N DFM manufactured by SII. The area in each measurement was 80×80 μm. The measurements were repeated three times at different sites. The Ra values and the ten-point average roughness values Rz were measured, and their averages were calculated to obtain the measured values.

[Production of Barrier Substrate (b)]

Smooth layers were formed on both sides of a heat-resistant substrate (substrate 11) composed of a 200-μm thick transparent polyimide film (Neopulim L manufactured by Mitsubishi Gas Chemical Co., Inc.), the two sides of which were subjected to an adhesive enhancing process as described below, to give a barrier substrate (b).

<Production of Smooth Layer Coating Solution>

Trimethylolpropane triglycidyl ether (8.0 g, Epolight 100MF manufactured by Kyoeisha Chemical Co. Ltd.), ethylene glycol diglycidyl ether (5.0 g, Epolight 40E manufactured by Kyoeisha Chemical Co. Ltd.), silsesquioxane having oxetanyl groups (OX-SQ-H) (12.0 g, manufactured by Toagosei Co. Ltd., 3-glycidoxypropyltrimethoxysilane (32.5 g), aluminum(III) acetylacetonate (2.2 g), methanol silica sol (134.0 g, manufactured by Nissan Chemical Industries, Ltd., solid content concentration of 30 mass %), BYK333 (0.1 g, manufactured by BYK Japan KK, silicone-based surfactant), butyl cellosolve (125.0 g), and 0.1 mol/L hydrochloric acid solution (15.0 g) were mixed and sufficiently stirred. The mixture was left at room temperature for degassing to obtain a smooth layer coating solution.

<Formation of First Smooth Layer>

One of the surfaces of the heat-resistant substrate (substrate 11) was treated by corona discharge in accordance with a known procedure. The smooth layer coating solution was then applied into a dry thickness of 3.0 μm and dried at 80° C. for three minutes. The coating solution was dried for ten more minutes at 120° C. to form a first smooth layer.

<Formation of Second Smooth Layer>

A second smooth layer was formed on the other surface, opposite from the first smooth layer, of the heat-resistant substrate (substrate 11) by the same procedure as that for the formation of the first smooth layer.

The surface roughnesses of the first and second smooth layers were each 2 nm for Ra and 25 nm for Rz through a measurement procedure in accordance with JIS B 0601. The surface roughness was measured in the same way as in the barrier substrate (a).

[Production of Barrier Substrate (c)]

A barrier substrate (c) was produced as in the barrier substrate (b) except that a 100-μm thick Silplus H100 film manufactured by Nippon Steel Chemical Co., Ltd., which is a film having a basic skeleton of silsesquioxane with an organic-inorganic hybrid structure was used as the heat-resistant substrate (substrate 11), instead of the 200-μm thick transparent polyimide film having ready-adhesive processing on both sides (Neopulim L manufactured by Mitsubishi Gas Chemical Co., Inc.). The surface roughnesses of the first and second smooth layers of the barrier substrate (c) were measured in the same way, and the results were each 1 nm for Ra and 20 nm for Rz.

[Production of Barrier Substrate (d)]

A thermoplastic resin substrate (substrate 11) composed of a 125-μm thick polyester film (KDL86W manufactured by Teijin DuPont Films Ltd.), the two sides of which were subjected to an adhesive enhancing process, was directly used as a barrier substrate (d). The surface roughnesses were measured in the same way, and the results were 4 nm for Ra and 320 nm for Rz.

[Production of Barrier Substrate (e)]

A thermoplastic resin substrate (substrate 11) composed of a 125-μm thick polyester film (A4300 manufactured by Toyobo Co., Ltd.), the two sides of which were subjected to an adhesive enhancing process, was directly used as a barrier substrate (e). The surface roughnesses were measured in the same way, and the results were 13 nm for Ra and 270 nm for Rz.

[Production of Barrier Substrate (f)]

A first primer coating solution was applied, at a density of 0.2 g/m$^2$, to one side of a thermoplastic resin substrate (substrate 11) composed of a 125-μm thick polyester film (KDL86W manufactured by Teijin DuPont Films Ltd.), the two side of which were subjected to an adhesive enhancing process and dried at 100° C. for three minutes into a first primer layer, to give a barrier substrate (f).

The surface roughnesses of the first primer layer were measured in the same way, and the results were 6 nm for Ra and 220 nm for Rz.

<Production of Coating Solution for First Primer Layer>

Colloidal silica Snowtex NXS (manufactured by Nissan Chemical Industries, Ltd.), Latex AE986B (manufactured by JSR Corporation), and a surfactant Surfynol 465 (manufactured by Air Products and Chemicals, Inc.) were mixed at a ratio of 80:19.8:0.2 by solid mass, the mixture was diluted with pure water to 5 mass %, and the dilution was filtered, to prepare a coating solution for the first primer layer.

<<Production of Gas Barrier Film>>

The barrier substrates (a) to (f) produced as described above were used to form gas barrier layers 14 corresponding to the various conditions listed in Tables 1-1 and 1-2 (combinations of conditions, such as the type of barrier substrate, the layer configuration of gas barrier layers, the composition and thickness of the gas barrier layers, and the vacuum ultraviolet irradiation condition), to form gas barrier films No. 1 to 27.

<Formation of Gas Barrier Layer>

A coating solution containing polysilazane that is described below was applied to a target barrier substrate with a spin coater such that the dry thickness would conform to the designed thickness. The drying was performed at 100° C. for two minutes, and the resulting film was irradiated with vacuum ultraviolet rays to form the gas barrier layer 14.

<Preparation of Coating Solution Containing Polysilazane>

A coating solution containing polysilazane was prepared from a solution of 20 mass % uncatalyzed perhydropolysilazane (NN120-20 manufactured by AZ Electronic Materials) dibutyl ether, an amine catalyst N,N,N',N'-tetramethyl-1,6-diaminohexane, and an optional component (one of the compounds S1 to S20, which are examples of the compound A described above, a compound S21, and the comparative compounds S22 to S24) listed in Tables 1-1 and 1-2 in predetermined amounts (refer to Tables 1-1 and 1-2). Compounds having low solubility in dibutyl ether were dissolved in methyl ethyl ketone before the mixing. The amount of the amine catalyst was 1 mass % to the solid content of the coating solution. The coating solution was appropriately diluted with dibutyl ether in accordance with the designed thickness.

The compounds S21 to S24 listed in Tables 1-1 and 1-2 are described below.

S21 indicates polysiloxane having organic groups having Si—H side chain(s), which is represented by the above-described general formula (4), has a molecular weight of 400 to 700, and belongs to the compound A.

S22 indicates polysiloxane having organic groups having Si—OH ends, which is represented by the above-described general formula (3), has a molecular weight of 400 to 700, and belongs to the compound A.

S23 indicates polysiloxane having organic groups having Si—H side chain(s), which is represented by the above-described general formula (4), has a molecular weight of 1800 to 2100, and does not belong to the compound A.

S24 does not belong to the compound A and indicates decamethylcyclopentasiloxane.

TABLE 1-1

| GAS BARRIER FILM SAMPLE No. | SUBSTRATE TYPE | LAYER CONFIGURATION OF GAS BARRIER LAYER | COMPOSITION AND THICKNESS OF GAS BARRIER LAYER ||| 
|---|---|---|---|---|---|
| | | | COMPOUND A OR COMPARATIVE COMPOUND | CONTENT OF COMPOUND [MASS %] | DRY THICKNESS [nm] |
| 1 | (a) | FIRST LAYER | NONE | | 200 |
| 2 | (a) | FIRST LAYER | NONE | | 600 |
| 3 | (a) | FIRST LAYER | NONE | | 250 |
| | | SECOND LAYER | NONE | | 250 |
| 4 | (a) | FIRST LAYER | NONE | | 250 |
| | | SECOND LAYER | NONE | | 250 |
| | | THIRD LAYER | NONE | | 250 |
| 5 | (a) | FIRST LAYER | S1 | 5 | 200 |
| 6 | (a) | FIRST LAYER | S1 | 10 | 600 |
| 7 | (a) | FIRST LAYER | S1 | 20 | 750 |
| 8 | (a) | FIRST LAYER | S3 | 10 | 200 |
| 9 | (a) | FIRST LAYER | S3 | 30 | 400 |
| 10 | (a) | FIRST LAYER | S6 | 5 | 200 |
| 11 | (a) | FIRST LAYER | S20 | 10 | 200 |
| 12 | (a) | FIRST LAYER | S20 | 10 | 600 |
| 13 | (a) | FIRST LAYER | S20 | 30 | 600 |
| 14 | (a) | FIRST LAYER | S21 | 5 | 200 |
| 15 | (b) | FIRST LAYER | S1 | 20 | 200 |

| GAS BARRIER FILM SAMPLE No. | VUV IRRADIATION CONDITIONS ||| REMARKS |
|---|---|---|---|---|
| | OXYGEN CONCENTRATION [%] | SAMPLE STAGE TEMPERATURE [° C.] | ACCUMULATED IRRADIATION ENERGY [mJ/cm$^2$] | |
| 1 | 0.1 | 80 | 3000 | COMPARATIVE EXAMPLE |
| 2 | 0.1 | 80 | 4500 | COMPARATIVE EXAMPLE |
| 3 | 0.1 | 80 | 2000 | COMPARATIVE EXAMPLE |
| | 0.1 | 80 | 2000 | |
| 4 | 0.1 | 80 | 2000 | COMPARATIVE EXAMPLE |
| | 0.1 | 80 | 2000 | |
| | 0.1 | 80 | 2000 | |
| 5 | 0.1 | 80 | 3000 | PRESENT INVENTION |
| 6 | 0.1 | 80 | 4500 | PRESENT INVENTION |
| 7 | 0.1 | 80 | 4500 | PRESENT INVENTION |
| 8 | 0.1 | 80 | 3000 | PRESENT INVENTION |
| 9 | 0.1 | 80 | 3000 | PRESENT INVENTION |
| 10 | 0.1 | 80 | 3000 | PRESENT INVENTION |
| 11 | 0.1 | 80 | 3000 | PRESENT INVENTION |
| 12 | 0.1 | 80 | 4500 | PRESENT INVENTION |
| 13 | 0.1 | 80 | 6000 | PRESENT INVENTION |
| 14 | 0.1 | 80 | 3000 | PRESENT INVENTION |
| 15 | 0.1 | 80 | 3000 | PRESENT INVENTION |

TABLE 1-2

| GAS BARRIER FILM SAMPLE No. | SUBSTRATE TYPE | LAYER CONFIGURATION OF GAS BARRIER LAYER | COMPOSITION AND THICKNESS OF GAS BARRIER LAYER |||
|---|---|---|---|---|---|
| | | | COMPOUND A OR COMPARATIVE COMPOUND | CONTENT OF COMPOUND [MASS %] | DRY THICKNESS [nm] |
| 16 | (c) | FIRST LAYER | S3 | 10 | 200 |
| 17 | (d) | FIRST LAYER | S1 | 10 | 600 |
| 18 | (e) | FIRST LAYER | S1 | 15 | 500 |
| 19 | (f) | FIRST LAYER | S1 | 10 | 400 |
| 20 | (f) | FIRST LAYER | S20 | 5 | 400 |
| 21 | (f) | FIRST LAYER | S20 | 20 | 600 |
| 22 | (f) | FIRST LAYER | NONE | | 200 |
| 23 | (f) | FIRST LAYER | NONE | | 600 |
| 24 | (a) | FIRST LAYER | S1 | 50 | 200 |

TABLE 1-2-continued

| | | | | | |
|---|---|---|---|---|---|
| 25 | (a) | FIRST LAYER | S22 | 45 | 200 |
| 26 | (a) | FIRST LAYER | S23 | 20 | 200 |
| 27 | (a) | FIRST LAYER | S24 | 20 | 200 |

| | VUV IRRADIATION CONDITIONS | | | |
|---|---|---|---|---|
| GAS BARRIER FILM SAMPLE No. | OXYGEN CONCEN- TRATION [%] | SAMPLE STAGE TEMPERATURE [° C.] | ACCUMULATED IRRADIATION ENERGY [mJ/cm$^2$] | REMARKS |
| 16 | 0.1 | 80 | 3000 | PRESENT INVENTION |
| 17 | 0.1 | 80 | 4500 | PRESENT INVENTION |
| 18 | 0.1 | 80 | 4500 | PRESENT INVENTION |
| 19 | 0.1 | 80 | 6000 | PRESENT INVENTION |
| 20 | 0.1 | 80 | 4500 | PRESENT INVENTION |
| 21 | 0.1 | 80 | 4500 | PRESENT INVENTION |
| 22 | 0.1 | 80 | 3000 | COMPARATIVE EXAMPLE |
| 23 | 0.1 | 80 | 4500 | COMPARATIVE EXAMPLE |
| 24 | 0.1 | 80 | 3000 | COMPARATIVE EXAMPLE |
| 25 | 0.1 | 80 | 3000 | COMPARATIVE EXAMPLE |
| 26 | 0.1 | 80 | 3000 | COMPARATIVE EXAMPLE |
| 27 | 0.1 | 80 | 3000 | COMPARATIVE EXAMPLE |

(Vacuum Ultraviolet Irradiation)

After the film containing polysilazane was formed as described above, the film was irradiated with vacuum ultraviolet rays with a vacuum-ultraviolet irradiation apparatus, which is described below, in accordance with a predetermined procedure, to form a gas barrier layer 14. The details of the irradiation conditions are listed in Tables 1-1 and 1-2.

<Vacuum-ultraviolet Irradiation Apparatus and Measurement of Irradiation Energy>

Figure 2:
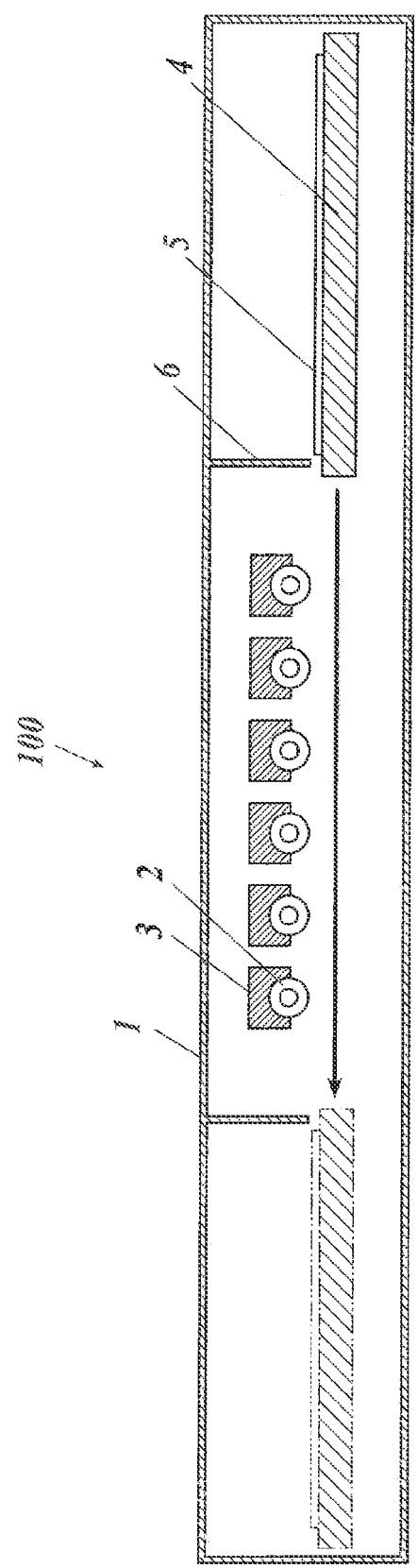
FIG. 2 is a schematic view of an example vacuum-ultraviolet irradiation apparatus.

A vacuum-ultraviolet irradiation apparatus 100, which is illustrated in FIG. 2, was used for the vacuum ultraviolet irradiation. With reference to FIG. 2, the vacuum-ultraviolet irradiation apparatus 100 includes a chamber 1, Xe excimer lamps 2, lamp holders 3, a sample stage 4, and a light shield 6.

The chamber 1 receives an appropriate amount of nitrogen gas and oxygen gas from a gas inlet (not shown) into the chamber and discharges these gases from a gas outlet (not shown), to substantially remove water vapor from the chamber and maintain the oxygen concentration at a predetermined level.

The Xe excimer lamps 2, for example, each have a double tube structure and can emit 172-nm vacuum ultraviolet rays.

The lamp holders 3 each hold a Xe excimer lamp 2 and also serve as an external electrode.

The sample stage 4 can be horizontally reciprocated inside the chamber 1 by a moving means (not shown) at a predetermined rate. The sample stage 4 is maintained at a predetermined temperature by a heating means (not shown). A sample 5 having a polysilazane film is placed on the sample stage 4 and is irradiated with vacuum ultraviolet rays. The height of the sample stage 4 is adjusted such that the distance between the surface of film of the sample 5 and the tube surfaces of the Xe excimer lamps 2 is at least 3 mm during the horizontal shift of the sample stage 4.

The light shield 6 prevents the film of the sample 5 from being irradiate with vacuum ultraviolet rays during the aging of the Xe excimer lamps 2.

The energy of the vacuum ultraviolet rays radiated from the vacuum-ultraviolet irradiation apparatus 100 on the surface of the film containing polysilazane of the sample 5 during the vacuum ultraviolet irradiation process was measured with a 172-nm sensor head of a UV power meter C8026/H8025 manufactured by Hamamatsu Photonics K.K.

The sensor head was disposed in the center of the sample stage 4 such that the distance between the tube surfaces of the Xe excimer lamps 2 and the measurement surface of the sensor head was at least 3 mm, nitrogen gas and oxygen gas were supplied to the chamber 1 to an oxygen concentration that is the same as that in the procedure of vacuum ultraviolet irradiation, and the energy was measured while the sample stage 4 was being moved at a rate of 0.5 m/min. Prior to the measurement, the Xe excimer lamps 2 were aged for 10 minutes to stabilize the illuminance after the Xe excimer lamps 2 were turned on. The sample stage 4 was then moved to start the measurement.

The moving rate of the sample stage 4 was adjusted on the basis of the measured irradiation energy to establish the irradiation energy listed in Tables 1-1 and 1-2. Similarly to the measurement of the irradiation energy, the vacuum ultraviolet irradiation was also carried out after 10 minutes of aging.

(Evaluation of Gas Barrier Film)

The characteristics of the resulting gas barrier films No. 1 to 27 were evaluated.

The evaluation items for the gas barrier films were cracking, water vapor barrier properties, and flexibility.

(Evaluation 1: Cracking)

The gas barrier layers 14 of the gas barrier films No. 1 to 27 were visually inspected for cracks. The results of the evaluation are listed in Tables 2-1 and 2-2.

(Evaluation 2: Water Vapor Barrier Properties)

The following apparatuses and materials were used for the evaluation of water vapor barrier properties.

<Apparatuses Used>

Deposition apparatus: vacuum deposition apparatus JEE-400 manufactured by JEOL, Ltd.

Thermo-hygrostat oven: Yamato Humidic Chamber IG47M

<Evaluation Material>

Metal corroding by reaction with water: calcium (granules)

Metal impermeable to water vapor: aluminum (granules having a diameter of 3 to 5 mm)

<Production of Evaluation Sample for Water Vapor Barrier Properties>

The vacuum deposition apparatus (JEE-400) was used to deposit metal calcium through a mask onto a 12×12-mm area on each surface of the gas barrier layers 14 of the gas barrier films (samples No. 1 to 27).

The mask was removed under the vacuum, aluminum was deposited to entirely cover one surface of each film, and the film was temporarily sealed. The vacuum was released and a dry nitrogen atmosphere was quickly introduced, a 0.2-mm thick quartz glass was bonded to the aluminum deposited surfaces with UV-curable resin for sealing (manufactured by Nagase Chemtex Corporation), and the resin was irradiated with ultraviolet rays to be cured and adhere for sealing, to form an evaluation sample for water vapor barrier properties.

The resulting evaluation sample was placed in the thermohygrostat oven under a high temperature of 60° C. and a high humidity of 90% RH for 20, 40, or 60 hours, and the ratio (%) of the corroded area to the 12×12-mm metal calcium deposition area was calculated, to evaluate the water vapor barrier properties in accordance with the following criteria.

○: The area of corroded metal calcium is less than 1.0%.
Δ: The area of corroded metal calcium is 1.0% or more and less than 5.0%.
X: The area of corroded metal calcium is 5.0% or more.

The results are listed in Tables 2-1 and 2-2.

(Evaluation 3: Flexibility)

Each of the gas barrier films No. 1 to 27 was reciprocally bent 100 times at a bending diameter of 20 mm. The gas barrier film was held such that the surface of the gas barrier layer 14 does not come into contact with the components of the measuring device or the hand of the operator. The results of visual observation on cracking of the gas barrier layers 14 after the reciprocal bending test are listed in Tables 2-1 and 2-2.

The evaluation of the water vapor barrier properties was conducted in the same way as in Evaluation 2. The results are listed in Tables 2-1 and 2-2.

TABLE 2-1

| GAS BARRIER FILM SAMPLE No. | EVALUATION 1 CRACKING | EVALUATION 2 WATER VAPOR BARRIER PROPERTIES | | | EVALUATION 3 FLEXIBILITY, CRACKING, AND WATER VAPOR BARRIER PROPERTIES | | | | REMARKS |
|---|---|---|---|---|---|---|---|---|---|
| | | 20 HOURS | 40 HOURS | 60 HOURS | CRACKING | 20 HOURS | 40 HOURS | 60 HOURS | |
| 1 | NOT OBSERVED | ○ | Δ | X | NOT OBSERVED | ○ | Δ | X | COMPARATIVE EXAMPLE |
| 2 | OBSERVED | X | X | X | OBSERVED | X | X | X | COMPARATIVE EXAMPLE |
| 3 | NOT OBSERVED | ○ | ○ | Δ | OBSERVED | X | X | X | COMPARATIVE EXAMPLE |
| 4 | OBSERVED | X | X | X | OBSERVED | X | X | X | COMPARATIVE EXAMPLE |
| 5 | NOT OBSERVED | ○ | ○ | Δ | NOT OBSERVED | ○ | ○ | Δ | PRESENT INVENTION |
| 6 | NOT OBSERVED | ○ | ○ | ○ | NOT OBSERVED | ○ | ○ | ○ | PRESENT INVENTION |
| 7 | NOT OBSERVED | ○ | ○ | ○ | NOT OBSERVED | ○ | ○ | ○ | PRESENT INVENTION |
| 8 | NOT OBSERVED | ○ | ○ | ○ | NOT OBSERVED | ○ | ○ | ○ | PRESENT INVENTION |
| 9 | NOT OBSERVED | ○ | ○ | ○ | NOT OBSERVED | ○ | ○ | ○ | PRESENT INVENTION |
| 10 | NOT OBSERVED | ○ | ○ | Δ | NOT OBSERVED | ○ | ○ | Δ | PRESENT INVENTION |
| 11 | NOT OBSERVED | ○ | ○ | ○ | NOT OBSERVED | ○ | ○ | ○ | PRESENT INVENTION |
| 12 | NOT OBSERVED | ○ | ○ | ○ | NOT OBSERVED | ○ | ○ | ○ | PRESENT INVENTION |
| 13 | NOT OBSERVED | ○ | ○ | ○ | NOT OBSERVED | ○ | ○ | ○ | PRESENT INVENTION |
| 14 | NOT OBSERVED | ○ | ○ | Δ | NOT OBSERVED | ○ | ○ | Δ | PRESENT INVENTION |

TABLE 2-2

| GAS BARRIER FILM SAMPLE No. | EVALUATION 1 CRACKING | EVALUATION 2 WATER VAPOR BARRIER PROPERTIES | | | EVALUATION 3 FLEXIBILITY, CRACKING, AND WATER VAPOR BARRIER PROPERTIES | | | | REMARKS |
|---|---|---|---|---|---|---|---|---|---|
| | | 20 HOURS | 40 HOURS | 60 HOURS | CRACKING | 20 HOURS | 40 HOURS | 60 HOURS | |
| 15 | NOT OBSERVED | ○ | ○ | ○ | NOT OBSERVED | ○ | ○ | ○ | PRESENT INVENTION |
| 16 | NOT OBSERVED | ○ | ○ | ○ | NOT OBSERVED | ○ | ○ | ○ | PRESENT INVENTION |
| 17 | NOT OBSERVED | ○ | ○ | ○ | NOT OBSERVED | ○ | ○ | ○ | PRESENT INVENTION |
| 18 | NOT OBSERVED | ○ | ○ | ○ | NOT OBSERVED | ○ | ○ | ○ | PRESENT INVENTION |

TABLE 2-2-continued

| GAS BARRIER FILM SAMPLE No. | EVALUATION 1 CRACKING | EVALUATION 2 WATER VAPOR BARRIER PROPERTIES | | | EVALUATION 3 FLEXIBILITY, CRACKING, AND WATER VAPOR BARRIER PROPERTIES | | | | REMARKS |
|---|---|---|---|---|---|---|---|---|---|
| | | 20 HOURS | 40 HOURS | 60 HOURS | CRACKING | 20 HOURS | 40 HOURS | 60 HOURS | |
| 19 | NOT OBSERVED | ○ | ○ | ○ | NOT OBSERVED | ○ | ○ | ○ | PRESENT INVENTION |
| 20 | NOT OBSERVED | ○ | ○ | ○ | NOT OBSERVED | ○ | ○ | ○ | PRESENT INVENTION |
| 21 | NOT OBSERVED | ○ | ○ | ○ | NOT OBSERVED | ○ | ○ | ○ | PRESENT INVENTION |
| 22 | NOT OBSERVED | Δ | X | X | NOT OBSERVED | Δ | X | X | COMPARATIVE EXAMPLE |
| 23 | OBSERVED | X | X | X | OBSERVED | X | X | X | COMPARATIVE EXAMPLE |
| 24 | NOT OBSERVED | Δ | X | X | NOT OBSERVED | Δ | X | X | COMPARATIVE EXAMPLE |
| 25 | NOT OBSERVED | X | X | X | NOT OBSERVED | X | X | X | COMPARATIVE EXAMPLE |
| 26 | NOT OBSERVED | X | X | X | NOT OBSERVED | X | X | X | COMPARATIVE EXAMPLE |
| 27 | NOT OBSERVED | X | X | X | NOT OBSERVED | X | X | X | COMPARATIVE EXAMPLE |

The results in Tables 2-1 and 2-2 demonstrate that the gas barrier films (No. 5 to 21) according to the present invention having a gas barrier layer 14 that contains a compound A within the range of 1 to 40 mass % (inclusive) with respect to the entire gas barrier layer exhibit superior gas barrier properties and high flexibility, the compound A satisfying all of the following conditions (a), (b), and (c): (a) the compound A has an Si—O bond and an organic group directly bonded to Si; (b) the compound A has an Si—H group or an Si—OH group; and (c) the compound A has a molecular weight of 90 or more and 1200 or less.

Even if the surface roughness Rz of the barrier substrate is between 200 to 500 nm, superior gas barrier properties are maintained.

The gas barrier films No. 15 and 16 were also evaluated for heat resistance.
(Evaluation 4: Heat Resistance)
The gas barrier films No. 15 and 16 were heated at 220° C. for 10 minutes in air. Each gas barrier film was held such that the surface of the gas barrier layer 14 does not come into contact with the components of the measuring device or the hand of the operator. The heated film was placed in a room atmosphere and was cooled to room temperature. The evaluation of the water vapor barrier properties was conducted in the same way as in Evaluation 2.

The results were satisfactory in the same manner as those without heating. The results demonstrate that the gas barrier films No. 15 and 16 according to the present invention have high heat resistance and superior gas barrier properties.

Example 2

<<Production of Electronic Apparatus and Organic EL Panel>>

Some (No. 1, 3, 5, 7, 11, 13, 15, 16, 19, and 21) of the gas barrier films according to Example 1 were used as sealing films to seal organic EL elements, which are electronic devices, to form organic EL panels (elements No. 1 to 10), which are electronic apparatuses. The gas barrier films used were reciprocally bent 100 times at a bending diameter of 20 mm, as in Example 1.

The overview of an organic EL panel will now be described. An example organic EL panel 20 including a gas barrier film 10 illustrated in FIG. 3 will now be described.

Figure 3:
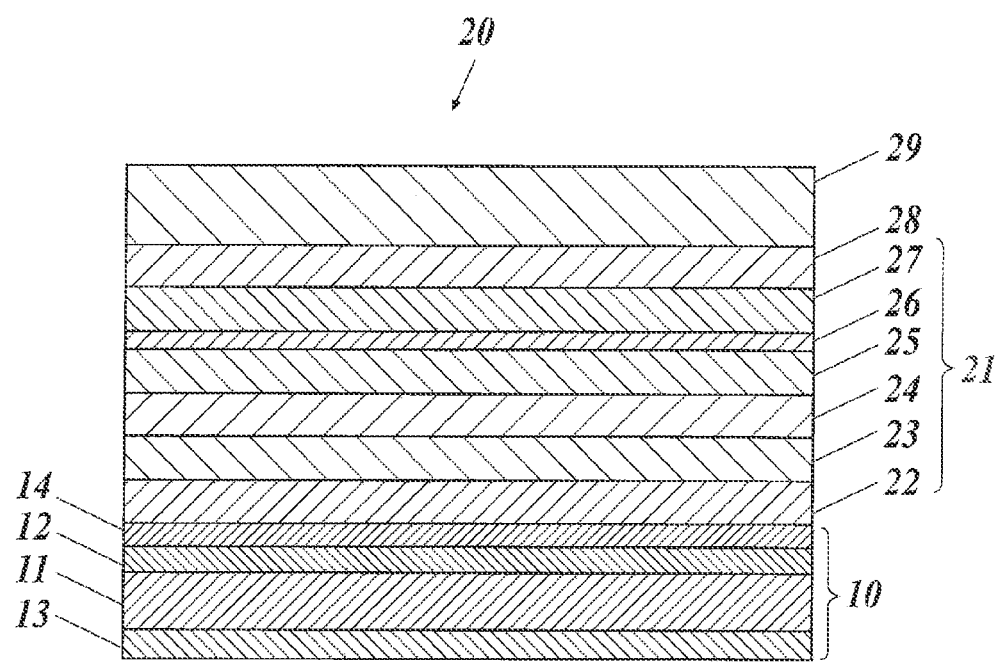
FIG. 3 is a schematic cross-sectional view of an example organic EL panel including a gas barrier film according to the present invention.

With reference to FIG. 3, the organic EL panel 20 includes, in sequence, a gas barrier layer 14 of the gas barrier film 10, a first electrode layer 22, a positive-hole transport layer 23, a light-emitting layer 24, an electron transport layer 25, an electron injecting layer 26, a second electrode layer 27, an adhesive layer 28, and a composite sealing member 29 of aluminum foil and a PET film (which is simply referred to as sealing member 29).

For example, an organic EL element 21 includes the first electrode layer 22, the positive-hole transport layer 23, the light-emitting layer 24, the electron transport layer 25, the electron injecting layer 26, and the second electrode layer 27. The organic EL element 21 is disposed between the gas barrier film 10 and the composite sealing member 29 of aluminum foil and a PET film (and the adhesive layer 28), and is sealed therewith at its sides, to form the organic EL panel 20.
[Production of Organic EL Element]
(Formation of First Electrode Layer)
A 150-nm thick ITO (indium tin oxide) layer was formed on the gas barrier layer 14 of the gas barrier film through sputtering, and was patterned through photolithography, to form the first electrode layer 22. The film was patterned into a light-emitting area of 50 mm$^2$.
(Formation of Positive-Hole Transport Layer)
A coating solution for a positive-hole transport layer, which is described below, was applied onto the first electrode layer 22 formed on the gas barrier film with an extrusion coater and dried, to form a positive-hole transport layer 23. The coating solution for the positive-hole transport layer was applied into a dry thickness of 50 nm. Before the coating solution for the positive-hole transport layer was applied, the cleaned surface of the film (first electrode layer 22) was modified with light having an irradiation intensity of 15 mW/cm$^2$ radiated from a low-pressure mercury lamp generating light having a wavelength of 184.9 nm at a distance of 10 mm. The charge was eliminated with an ionizer using weak X-rays.

<Coating Solution for Positive-Hole Transport Layer>

Polyethylenedioxythiophene polystyrenesulfonate (PEDOT/PSS) (Bytron P AI 4083 manufactured by Bayer AG) was diluted into 65% with pure water and then into 5% with methanol, to prepare the coating solution for a positive-hole transport layer.

<Application Conditions>

The coating solution was applied in air at 25° C. and a relative humidity of 50%.

<Drying and Heating Conditions>

After the coating solution for the positive-hole transport layer was applied, the solvent was removed in a hot air stream at 100° C. applied toward the film surface at a discharge flow rate of 1 m/s and a flow rate distribution of 5% across the width from a height of 100 mm, and the film was heated at 150° C. from the back side with a heating device, to form a positive-hole transport layer 23.

(Formation of Light-Emitting Layer)

A coating solution for a white-light emitting layer, which is described below, was applied with an extrusion coater onto the positive-hole transport layer 23 formed over the gas barrier film and dried, to form a light-emitting layer 24. The coating solution for a white-light emitting layer was applied into a dry thickness of 40 nm.

<Coating Solution for White-Light Emitting Layer>

A host material "H-A" (1.0 g), a dopant "D-A" (100 mg), a dopant "D-B" (0.2 mg), and a dopant "D-C" (0.2 mg) were dissolved in 100 g of toluene to prepare a coating solution for a white-light emitting layer.

[Formula 8]

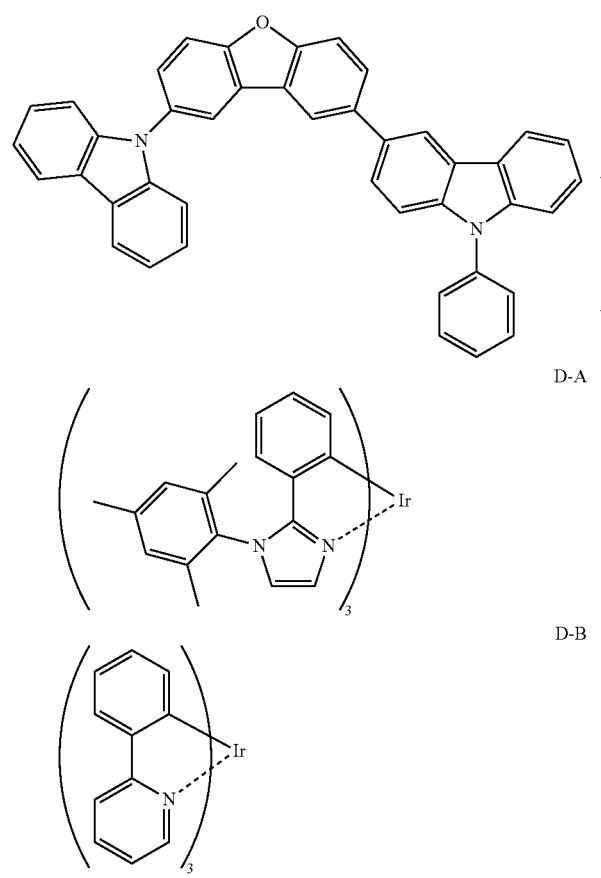

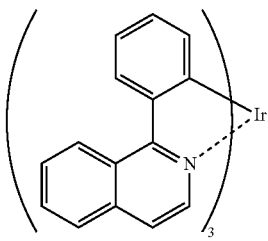

<Application Conditions>

The coating solution, heated to 25° C., was applied in an atmosphere having a nitrogen gas concentration of 99% or more at an application rate of 1 m/min.

<Drying and Heating Conditions>

After the coating solution for the white-light emitting layer was applied, the solvent was removed in a hot air stream at 60° C. applied toward the film surface at a discharge flow rate of 1 m/s and a flow rate distribution of 5% across the width from a height of 100 mm, and the film was heated at 130° C., to form a light-emitting layer 24.

(Formation of Electron Transport Layer)

A coating solution for an electron transport layer, which is described below, was applied to the light-emitting layer 24 formed over the gas barrier film with an extrusion coater and dried, to form an electron transport layer 25. The coating solution for the electron transport layer was applied into a dry thickness of 30 nm.

<Coating Solution for Electron Transport Layer>

A material for an electron transport layer "E-A" was dissolved in 2,2,3,3-tetrafluoro-1-propanol to prepare a 0.5 mass % solution as a coating solution for an electron transport layer.

[Formula 9]

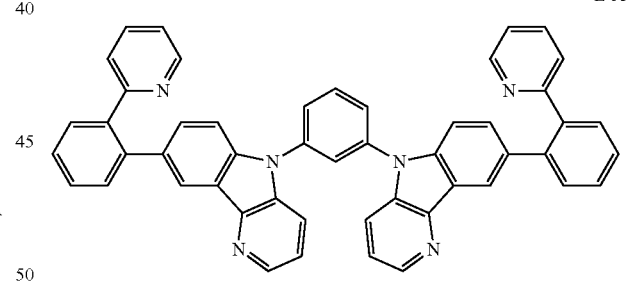

<Application Conditions>

The coating solution, heated to 25° C., was applied in an atmosphere having a nitrogen gas concentration of 99% or more at an application rate of 1 m/min.

<Drying and Heating Conditions>

After the coating solution for the electron transport layer was applied, the solvent was removed in a hot air stream at 60° C. applied toward the film surface at a discharge flow rate of 1 m/s and a flow rate distribution of 5% across the width from a height of 100 mm, and the film was heated at 200° C., to form an electron transport layer 25.

(Formation of Electron Injecting Layer)

An electron injecting layer 26 was formed on the electron transport layer 25 over the gas barrier film.

The gas barrier film having the electron transport layer 25 thereover was placed in a decompression chamber, which was evacuated to $5\times10^{-4}$ Pa. Cesium fluoride provided on a tantalum deposition boat placed in the decompression chamber in advance was heated to form an electron injecting layer 26 having a thickness of 3 nm.

(Formation of Second Electrode Layer)

A second electrode layer 27 was formed on the electron injecting layer 26 over the gas barrier film.

A second electrode material composed of aluminum was deposited under a vacuum of $5\times10^{-4}$ Pa on the electron injecting layer 26 formed at the area other than the area above the extraction electrode for the first electrode layer 22, to form a mask pattern having a light-emitting area of 50 mm² to form a 100-nm thick deposition film. The second electrode layer 27 was thus formed.

(Cutting)

The film including the first electrode layer 22 to the second electrode layer 27 on the gas barrier film was placed in a nitrogen atmosphere again and cut into pieces having a predetermined size with an ultraviolet laser, to form an organic EL element 21.

(Electrode Lead Connection)

The resulting organic EL elements 21 was connected to a flexible printed circuit board (base film composed of polyimide (12.5 μm) and rolled copper foil (18 μm), and a coverlay composed of polyimide (12.5 μm) having a surface plated with NiAu) via an anisotropically conductive film DP3232S9 manufactured by Sony Chemical & Information Device Corporation.

Connection conditions: Pressure bonding at 170° C. (ACF temperature of 140° C. measured with a separate thermocouple), under a pressure of 2 MPa for 10 seconds.

(Sealing)

The organic EL element 21 connected to an electrode lead (flexible printed circuit board) was bonded to a sealing member 29 with a commercially-available roller laminator, to form each of the organic EL panels (elements No. 1 to 10). The sealing member 29 was composed of a laminate (with a 1.5-μm thick adhesive layer) of 30-μm thick aluminum foil (manufactured by Toyo aluminum K.K.) and a 12-μm thick polyethylene terephthalate (PET) film bonded together with a dry lamination adhesive (two-component reaction urethane adhesive).

A heat-curable adhesive was uniformly applied into a thickness of 20 μm onto the aluminum foil surface of the sealing member 29 with a dispenser. The heat-curable adhesive was an epoxy adhesive composed of a mixture of bisphenol A diglycidyl ether (DGEBA), dicyandiamide (DICY), and an epoxy-adduct curing accelerator.

The sealing member 29 with the adhesive applied thereon was disposed to cover the connection between the extraction electrode on the organic EL element 21 and the electrode lead, and the organic EL element 21 was tightly sealed with a pressing roller. Organic EL panels (elements No. 1 to 10) were thus produced. The pressure-bonding conditions included a pressing roller temperature of 120° C., a pressure of 0.5 MPa, and a roller rate of 0.3 m/min.

(Evaluation of Organic EL Element and Organic EL Panel)

The organic EL panels (elements No. 1 to 10) formed as described above were evaluated for durability in accordance with the following procedures.

(Evaluation of Durability)

The organic EL panels (elements No. 1 to 10) were subjected to an accelerated deterioration process at 60° C. in a 90% RH environment for 400 hours and were evaluated for black spots together with organic EL panels on which no accelerated deterioration process was performed.

(Evaluation of Black Spots)

An electric current of 1 mA/cm² was applied to the organic EL panels on which the accelerated deterioration process had been performed and the organic EL panels with no accelerated deterioration process to turn on the panels continuously for 24 hours. Partially magnified images of the panels were captured with a 100× microscope (MS-804 equipped with an MP-ZE25-200 lens manufactured by Moritex Corporation). The captured image was cut into 2 mm² squares to determine the ratio of the area of the block spots, the deterioration-resistance rate of each element was calculated in accordance with the following expression, and the durability was evaluated in accordance with the following criteria.

Ranks of ⊚ and ○ indicate that the panel is usable in practice.

Deterioration-resistance rate of element (%)=[Area of black spots generated in element (panel) on which no accelerated deterioration process was performed]/ [Area of black spots generated in element (panel) on which the accelerated deterioration process had been performed]×100

⊚: Deterioration-resistance rate of element is 90% or more.
○: Deterioration-resistance rate of element is 60% or more and less than 90%.
Δ: Deterioration-resistance rate of element is 20% or more and less than 60%.
X: Deterioration-resistance rate of element is less than 20%.

The results determined in this way are listed in Table 3.

TABLE 3

| ELEMENT No. | GAS BARRIER FILM SAMPLE No. | EVALUATION OF ORGANIC EL ELEMENT | REMARKS |
|---|---|---|---|
| 1 | 1 | X | COMPARATIVE EXAMPLE |
| 2 | 3 | X | COMPARATIVE EXAMPLE |
| 3 | 5 | ○ | PRESENT INVENTION |
| 4 | 7 | ⊚ | PRESENT INVENTION |
| 5 | 11 | ⊚ | PRESENT INVENTION |
| 6 | 13 | ⊚ | PRESENT INVENTION |
| 7 | 15 | ⊚ | PRESENT INVENTION |
| 8 | 16 | ⊚ | PRESENT INVENTION |
| 9 | 19 | ○ | PRESENT INVENTION |
| 10 | 21 | ○ | PRESENT INVENTION |

The results in Table 3 demonstrate that the gas barrier film according to the present invention has superior gas barrier properties suitable for a sealing film for organic EL elements, and that an organic EL panel including the gas barrier film according to the present invention has excellent durability.

The gas barrier film 10 according to the present invention has superior gas barrier properties, and thus an electronic apparatus having the gas barrier film 10 has excellent durability.

The present invention should not be limited to the embodiments described above and may be appropriately modified within the scope of the invention.

INDUSTRIAL APPLICABILITY

The present invention, configured as described above, can be applied to gas barrier films and electronic apparatuses having gas barrier films.

REFERENCE NUMERALS

10 gas barrier film
11 substrate
12 intermediate layer
13 bleed preventing layer
14 gas barrier layer
20 organic EL panel (electronic apparatus)
21 organic EL element (electronic device)
100 vacuum ultraviolet irradiation apparatus

The invention claimed is:

1. A gas barrier film comprising:
   a substrate; and
   a gas barrier layer disposed over the substrate, the gas barrier layer being formed by irradiating a layer containing polysilazane and a compound A with vacuum ultraviolet rays,
   wherein
   the gas barrier layer contains the compound A in an amount of 5 mass % or more and 30 mass % or less with respect to the entire gas barrier layer, the compound A satisfying all of following conditions (a), (b), and (c):
   (a) the compound A has an Si—O bond and an organic group which is any one of a methyl group, an ethyl group, and a phenyl group directly bonded to Si;
   (b) the compound A has an Si—H group or an Si—OH group; and
   (c) the compound A has a molecular weight of 90 or more and 1200 or less,
   the compound A has a structure represented by Formula (1):

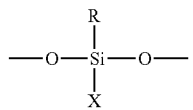

wherein R represents the organic group, and X represents H or OH, and
   the compound A has an Si—O—Si bond.

2. The gas barrier film according to claim 1, wherein the compound A has a cyclic or cage structure including the Si—O—Si bond.

3. The gas barrier film according to claim 1, wherein the organic group is any one of a methyl group, an ethyl group, and a phenyl group.

4. The gas barrier film according to claim 1, wherein the substrate has a surface roughness Rz of 200 nm or more and 500 nm or less.

5. The gas barrier film according to claim 1, further comprising:
   at least one intermediate layer disposed between the substrate and the gas barrier layer,
   wherein a surface, in contact with the gas barrier layer, of the intermediate layer has a surface roughness Rz of 200 nm or more and 500 nm or less.

6. The gas barrier film according claim 1, wherein the gas barrier layer has a thickness of at least 250 nm.

7. An electronic apparatus comprising:
   the gas barrier film according to claim 1; and
   an electronic device sealed with the gas barrier film.

\* \* \* \* \*